US010826158B2

(12) United States Patent
Mukherjee et al.

(10) Patent No.: US 10,826,158 B2
(45) Date of Patent: Nov. 3, 2020

(54) PRINTED AND/OR THIN FILM INTEGRATED CIRCUIT WITH INTEGRATED ANTENNA, AND METHODS OF MAKING AND USING THE SAME

(71) Applicant: Thin Film Electronics ASA, Oslo (NO)

(72) Inventors: Somnath Mukherjee, Milpitas, CA (US); Aditi Chandra, Los Gatos, CA (US); Mao Ito, Cupertino, CA (US); Arvind Kamath, Los Altos, CA (US); Scott Bruner, San Jose, CA (US); Sambhu Kundu, Fremont, CA (US); Anand Deshpande, Cupertino, CA (US)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 16/287,126

(22) Filed: Feb. 27, 2019

(65) Prior Publication Data
US 2019/0267698 A1      Aug. 29, 2019

Related U.S. Application Data

(60) Provisional application No. 62/636,054, filed on Feb. 27, 2018.

(51) Int. Cl.
*H01L 23/52* (2006.01)
*H01Q 1/22* (2006.01)
(Continued)

(52) U.S. Cl.
CPC .......... *H01Q 1/2283* (2013.01); *H01L 23/528* (2013.01); *H01L 23/5226* (2013.01);
(Continued)

(58) Field of Classification Search
CPC .......... H01Q 1/2283; H01Q 3/00; H01Q 7/00; H01L 23/5226; H01L 23/528;
(Continued)

(56) References Cited

U.S. PATENT DOCUMENTS

| 2003/0025186 A1* | 2/2003 | Leduc ............... G06K 19/0775 257/679 |
| 2006/0102374 A1 | 5/2006 | Heide |

(Continued)

OTHER PUBLICATIONS

International Search Report and Written Opinion; International Searching Authority/US dated May 31, 2019; International Application No. PCT/US2019/019860; 11 pages; International Searching Authority/U.S.; Commissioner for Patents, Alexandria, VA.

*Primary Examiner* — Jimmy T Vu
(74) *Attorney, Agent, or Firm* — Andrew D. Fortney; Central California IP Group, P.C.

(57) ABSTRACT

A wireless communication device having an integrated antenna, and methods for making and using the same are disclosed. The device generally includes (a) a substrate; (b) an integrated circuit (IC) comprising a plurality of printed and/or thin film layers and/or structures on the substrate, (c) a dielectric or insulator layer in at least one area of the substrate other than the IC; and (d) an antenna on the dielectric or insulator layer, comprising one or more metal traces. The plurality of printed and/or thin film layers and/or structures include an uppermost layer of metal. The antenna has (i) an inner terminal continuous with the uppermost layer of metal or connected to the uppermost layer of metal through one or more contacts, and (ii) an outer terminal connected to the uppermost layer of metal through one or more contacts and optionally a metal bridge or strap.

20 Claims, 20 Drawing Sheets

(51) Int. Cl.
  *H01L 23/532* (2006.01)
  *H01L 23/528* (2006.01)
  *H01L 23/64* (2006.01)
  *H01L 23/522* (2006.01)
  *H01L 23/66* (2006.01)

(52) U.S. Cl.
  CPC ...... *H01L 23/53214* (2013.01); *H01L 23/645* (2013.01); *H01L 23/66* (2013.01)

(58) Field of Classification Search
  CPC . H01L 23/53214; H01L 23/645; H01L 23/66; H01L 23/64
  See application file for complete search history.

(56) References Cited

U.S. PATENT DOCUMENTS

| | | |
|---|---|---|
| 2008/0158087 A1 | 7/2008 | Rofougaran |
| 2012/0119963 A1 | 5/2012 | Soekawa |
| 2012/0181654 A1* | 7/2012 | Lue .................... H01L 21/8221 257/506 |
| 2013/0210276 A1 | 8/2013 | Rathburn |
| 2013/0307747 A1 | 11/2013 | Koide |
| 2015/0129667 A1 | 5/2015 | Pavate et al. |
| 2015/0227832 A1 | 8/2015 | Diorio et al. |
| 2015/0269473 A1 | 9/2015 | Ottobon et al. |
| 2016/0197651 A1 | 7/2016 | Tsukamoto |
| 2016/0323972 A1 | 11/2016 | Bora et al. |
| 2017/0040665 A1 | 2/2017 | Takashima et al. |

* cited by examiner

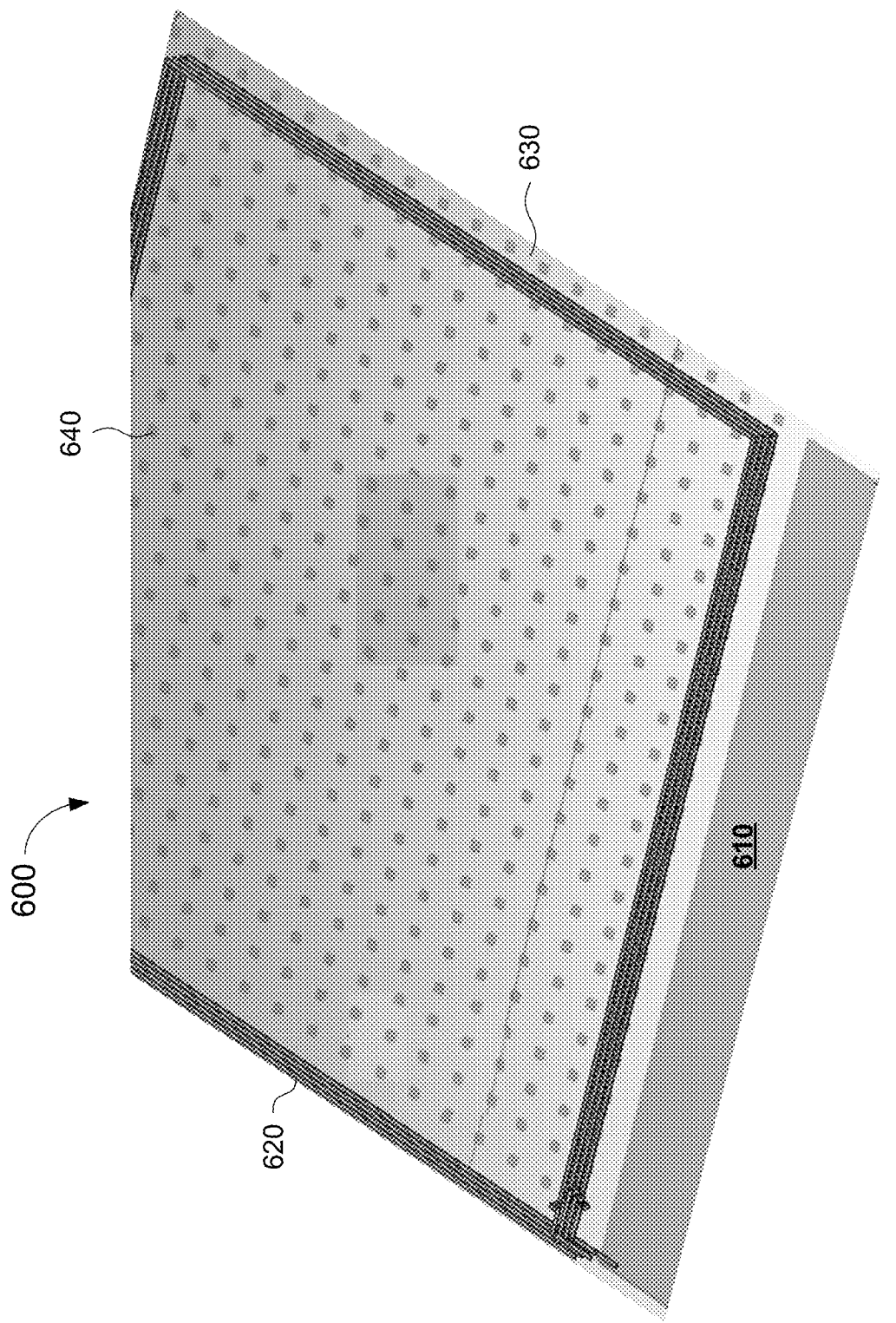

PRINTED AND/OR THIN FILM INTEGRATED CIRCUIT WITH INTEGRATED ANTENNA, AND METHODS OF MAKING AND USING THE SAME

RELATED APPLICATION(S)

The present application claims priority to U.S. Provisional Pat. Appl. No. 62/636,054, filed Feb. 27, 2018, incorporated herein by reference in its entirety.

FIELD OF THE INVENTION

The present invention generally relates to the field of printed and thin film integrated circuits having an antenna (e.g., for wireless communications). More specifically, embodiments of the present invention pertain to a printed and/or thin film integrated circuit (PIC) having an integrated antenna, and methods for making and using the same.

DISCUSSION OF THE BACKGROUND

Currently, printed and thin film integrated circuits (PICs) for wireless applications may employ direct electrical connections between the integrated circuit (e.g., through bond pads and/or conductive bumps) and the main antenna (typically comprising an aluminum trace or coil). Such connections are made by one or more of several types of attach processes (e.g., pick-and-place, crimping, application of conductive and/or nonconductive adhesive, etc.). Such processes and materials increase back-end costs of the PIC. Presently, this cost is on the order of $0.10-0.20 per die. The costs associated with such antenna attachment technologies affect the advantages of printing and thin film processing technologies over conventional monolithic Si processing for commercial products.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention relate to a wireless communication device having an integrated antenna, and methods for making and using the same. The device generally comprises (a) a substrate; (b) an integrated circuit (IC) comprising a plurality of printed and/or thin film layers and/or structures on the substrate, (c) a dielectric or insulator layer in at least one area of the substrate other than the IC; and (d) an antenna on the dielectric or insulator layer, comprising one or more metal traces. The plurality of printed and/or thin film layers and/or structures include an uppermost layer of metal. The antenna has (i) an inner terminal continuous with the uppermost layer of metal or connected to the uppermost layer of metal through one or more contacts, and (ii) an outer terminal connected to the uppermost layer of metal through one or more contacts and optionally a metal bridge or strap. The method of making comprises forming the IC and the insulating layer on the substrate, and forming the antenna on or over the substrate such that terminals of the antenna are integrally connected to the uppermost layer of metal in the IC.

In various embodiments, the antenna has a two-dimensional or planar spiral or coil structure. In such embodiments, the wireless communication device may further comprise a ferrite layer between the antenna and the substrate. The ferrite layer is configured to reduce adverse electromagnetic effects of the substrate on the antenna.

In embodiments where the antenna comprises a two-dimensional spiral or coil structure, the wireless communication device may comprise the metal bridge or strap and a plurality of contacts. The metal bridge or strap may connect the outer terminal to the uppermost layer of metal. A first one of the contacts may directly or indirectly connect one of the inner and outer terminals and the metal bridge, and a second one of the contacts may directly or indirectly connect the metal bridge and the uppermost layer of metal.

In embodiments comprising a two-dimensional antenna, the substrate may be patterned to match a pattern of the antenna. Alternatively, the substrate may include one or more slits therein, configured to induce controlled eddy currents in the substrate and/or reduce or negate adverse electromagnetic effects of the substrate.

Alternatively, the antenna may have a three-dimensional spiral or coil structure having a rotational axis parallel to the substrate. In such an alternative, the antenna may comprise (i) a first plurality of traces in a lower metal layer, (ii) a second plurality of traces in an upper metal layer, and (iii) a plurality of contacts. Each of the plurality of contacts may uniquely connect one of the first plurality of traces and one of the second plurality of traces. The antenna may also further comprise a second dielectric or insulator layer between the lower metal layer and the upper metal layer. In some examples, each of the first and second pluralities of traces may be linear or substantially linear. The second plurality of traces may be offset from the first plurality of traces, in which case the antenna may further comprise a plurality of offset segments, each configured to connect an end of one of the first and second plurality of traces to a corresponding one of the contacts.

In further alternative embodiments, the antenna may have a three-dimensional spiral or coil structure having a rotational axis parallel to the substrate. In such embodiments, the antenna may comprise (i) a plurality of metal layers, (ii) a plurality of insulator layers, each of which is between adjacent ones of the plurality of metal layers, and (iii) a contact in each of the plurality of insulator layers. Each contact may be configured to connect adjacent ones of the plurality of metal layers. In addition, each of the plurality of metal layers may comprise a trace having a substantially closed geometric shape, and the antenna may comprise a plurality of offset segments, each configured to connect an end of one of the traces to a corresponding one of the contacts.

In certain embodiments, the IC may further comprise one or more pads, configured to receive an incoming signal from the antenna and transmit an outgoing signal to the antenna by capacitive or magnetic coupling. The IC pad(s) may be relatively large, and the capacitive or magnetic coupling pads may be between the IC pad(s) and either or both of a section of the outermost loop of the antenna or pads electrically coupled or connected to the antenna.

In other or further embodiments, the substrate may comprise a two-dimensional array of metal elements. The two-dimensional array of metal elements may comprise a plurality of rows and a plurality of columns. In such embodiments, each of the metal elements may have a regular geometric shape.

In substantially any of the embodiments described herein, the present wireless communication device may further comprise the metal bridge or strap connecting the outer terminal of the antenna to the uppermost layer of metal. Additionally or alternatively, the substrate may comprise a center opening.

In further embodiments, the present invention may relate to a package, container or article, comprising the present wireless communication device thereon or therein.

A further aspect of the present invention relates to a method of making a wireless communication device, comprising forming an integrated circuit (IC) on a substrate, forming a dielectric or insulator layer in at least one area of the substrate other than the IC, and forming an antenna on the dielectric or insulator layer. The IC comprises a plurality of printed and/or thin film layers and/or structures, including an uppermost layer of metal. The antenna comprises one or more metal traces, and has (i) an inner terminal continuous with the uppermost layer of metal or connected to the uppermost layer of metal through one or more contacts, and (ii) an outer terminal connected to the uppermost layer of metal through one or more contacts and optionally a metal bridge or strap. At least one of the metal traces has a composition and a thickness identical or substantially identical to the uppermost layer of metal.

The present invention advantageously eliminates separate attachment processes, such as bumping, crimping, application of adhesive(s), etc., for making connections between a PIC and an associated antenna, as well as the physical structures associated therewith (e.g., solder bumps). Antenna attachment is simplified, and can be done with low precision. The backend cost of the wireless PIC (e.g., PIC with integrated antenna) is dramatically reduced relative to the same PIC attached to a separate antenna on a separate substrate. In addition, the large PIC area is viable with R2R processing.

These and other advantages of the present invention will become readily apparent from the detailed description of various embodiments below.

BRIEF DESCRIPTION OF THE DRAWINGS

FIG. 6 is a diagram showing an exemplary printed and/or thin film integrated circuit (PIC) including an integrated antenna according to a sixth configuration.

DETAILED DESCRIPTION

Figure 1A:
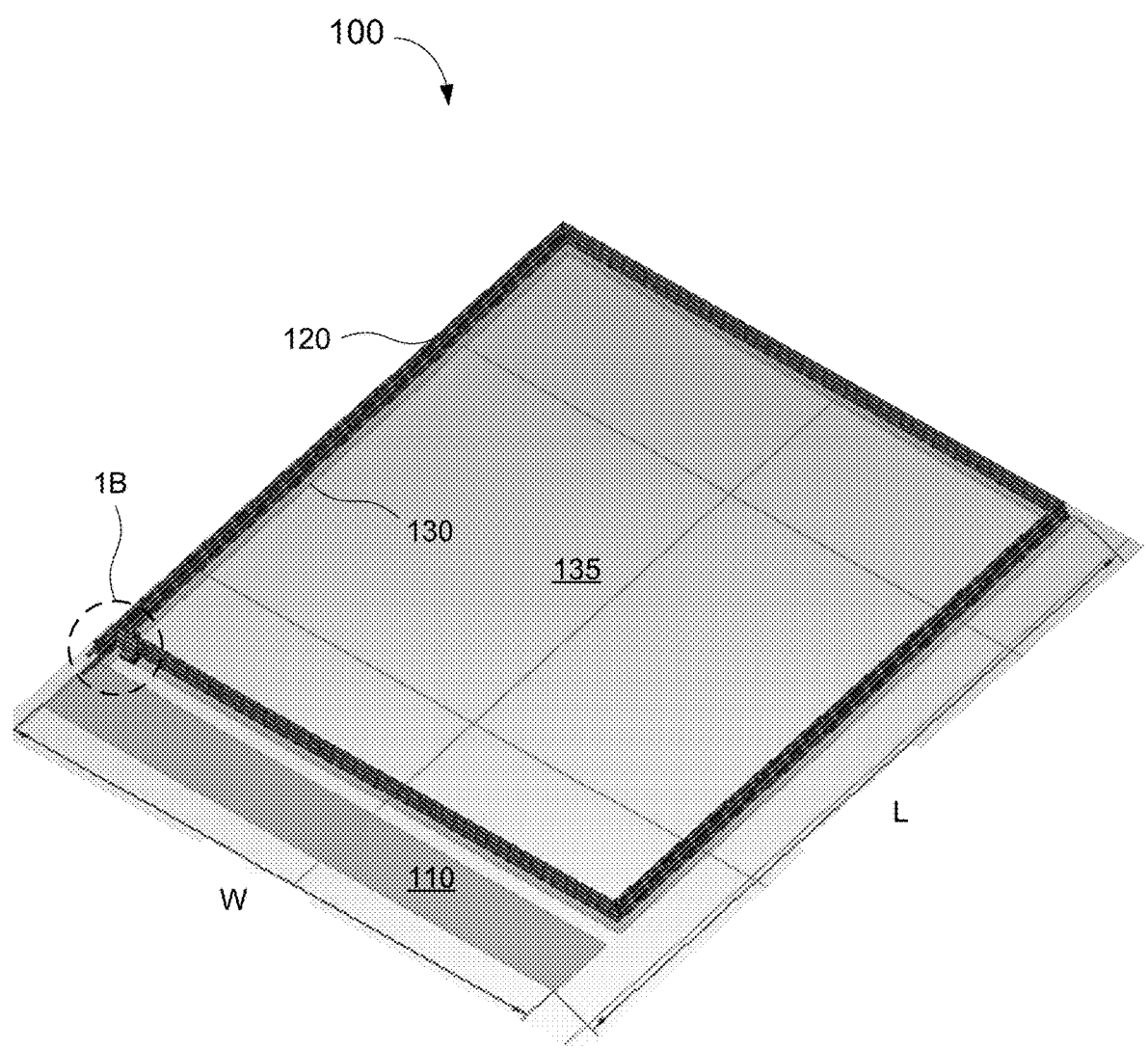
FIGS. 1A-B are diagrams showing an exemplary printed and/or thin film integrated circuit (PIC) including an integrated antenna according to a first configuration.

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

The technical proposal(s) of embodiments of the present invention will be fully and clearly described in conjunction with the drawings in the following embodiments. It will be understood that the descriptions are not intended to limit the invention to these embodiments. Based on the described embodiments of the present invention, other embodiments can be obtained by one skilled in the art without creative contribution and are in the scope of legal protection given to the present invention.

Furthermore, all characteristics, measures or processes disclosed in this document, except characteristics and/or processes that are mutually exclusive, can be combined in any manner and in any combination possible. Any characteristic disclosed in the present specification, claims, Abstract and Figures can be replaced by other equivalent characteristics or characteristics with similar objectives, purposes and/or functions, unless specified otherwise.

For the sake of convenience and simplicity, the terms "integrated circuit," "printed integrated circuit," "printed and/or thin film integrated circuit," and "PIC" are generally used interchangeably herein, but are generally given their art-recognized meanings. In addition, the terms "stamping" and "punching" (as well as grammatical variations thereof) are used interchangeably herein. Also, for convenience and simplicity, the terms "connected to," "coupled with," "coupled to," and "in communication with," which connections, couplings and communications include direct and indirect connections, couplings and communications unless the context unambiguously indicates otherwise, but these terms are also generally given their art-recognized meanings.

A process for making printed doped polysilicon (PDPS) structures from a liquid-phase polysilane ink and a printed dopant ink allows integration of an antenna in the method of making an integrated circuit (IC). In some embodiments, the antenna is magnetically or capacitively coupled to the PIC, so there is no direct electrical connection between the PIC and the main antenna. This removes any need to make a physical connection between the PIC and the main antenna. Furthermore, the large area of PICs makes the manufacture of PICs viable with roll-to-roll (R2R) processing, which can also be used to make and assemble antennas (e.g., in security and near-field communication [NFC] tags). This enables the use of thin film and printing processes to make an IC (e.g., a PIC) with an integrated antenna, a manufacturing method that is not viable with conventional monolithic Si processing.

A relatively large number of configurations can be envisioned for such PICs with integrated antennas. In a first configuration, the antenna may comprise a three-dimensional (3D) spiral structure, with an axis perpendicular to the substrate supporting the antenna and IC. In many embodiments, the substrate is a sheet or film of a metal or metal alloy, such as steel (e.g., stainless steel), aluminum, titanium, etc. In this configuration, the precision of a stamping process (e.g., to remove relatively large areas of the substrate) need not be high. In addition, only relatively small cuts may be made in the substrate, either before or after stamping. For example, stamping the substrate to form one or more openings therein may also form (or retain) relatively small links between adjacent dies (e.g., for continuity of the substrate in roll-to-roll-processing). Such links can be eliminated when making these small cuts.

In a second configuration, the antenna may comprise a planar spiral structure. However, a relatively high-precision stamping process may be needed to make ICs with an integrated antenna in this configuration. A mechanical bridge remains (e.g., is fabricated) in the substrate after stamping, to electrically connect the IC with the inner terminal of the antenna.

In a third configuration, the antenna may comprise a 3D spiral structure with an axis parallel to the substrate. The 3D spiral antenna communicates wirelessly with a larger secondary antenna, which in turn communicates wirelessly with a reader. Magnetic coupling between the 3D spiral and the secondary antenna may be limited by the height of the spiral, which may therefore limit signal strength and/or read distance. However, the substrate can be unpatterned in this configuration, and such a configuration may be suitable for applications requiring a short read distance (e.g., NFC communications).

In a fourth configuration, the antenna may comprise a two-dimensional (2D) spiral structure similar to the second configuration, in which the substrate includes one or more slits therein. Such a configuration may be useful for inducing controlled eddy currents in the substrate, which can reduce the adverse effects of a metal substrate that is relatively close to 2D spiral antenna, or in some case, enhance the sensitivity and/or read range of the antenna.

In a fifth configuration, the antenna communicates with the IC by capacitive coupling. Thus, the antenna is not literally integrated into the PIC, but the PIC and the antenna may be formed at the same time, using the same printing and/or thin film processes. The capacitance is between relatively large pads on the PIC and pads and/or a section of the outermost loop of the antenna.

In a sixth configuration, the conductive substrate (e.g., steel) is selectively removed to create a 2D array of conductive structures. The array provides mechanical rigidity, yet breaks any induced eddy current(s).

The invention, in its various aspects, will be explained in greater detail below with regard to exemplary embodiments.

A First Exemplary Configuration

FIG. 1A shows a first configuration 100 of the PIC 110 with an integrated antenna 120 in a 3D spiral structure, with the axis of the spiral perpendicular to the substrate. In one example, the substrate may comprise stainless steel (see U.S. Pat. Nos. 9,183,973 and 9,299,845. The antenna 120 has a substantially spiral structure (e.g., when viewed from the side), and a square or rectangular shape in a plan view (as shown), although other shapes are suitable. At least one side of the antenna 120 should be linear (straight or substantially straight). For example, the square or rectangular antenna 120 may have a width W of from 2 to 20 mm, the PIC 110 may have a length equal to or less than the width W of the antenna, the length L of the combined antenna 120 and PIC 110 may be from 3 to 30 mm, and the PIC 110 may have a width of from 1 to 8 mm, but the dimensions of the antenna 120 and PIC 110 are not so limited. When the antenna 120 is round or circular, it may have a diameter of from 2 to 20 mm.

Dielectric layers (not shown) separate layers of the spiral. Adjacent layers of the antenna 120 are connected by one or more contacts (see FIG. 1B) through the dielectric layer separating the adjacent antenna layers. At least one of the layers of the antenna 120 and at least one of the intervening dielectric layers (not shown) are made at the same time as a corresponding layer in the PIC 110, using the same material (s) and the same equipment.

In this configuration, the substrate is stamped in middle to remove areas of the substrate not useful or necessary for supporting the PIC 110 or the antenna 120, for example forming a center opening 135. Thus, the stamping precision need not be high. Small cuts (e.g., from a few tens to a few hundreds of μm long) in the substrate before or after stamping may reduce any induced eddy currents in the metallic substrate. However, care should be taken when cutting the substrate 130 after fabrication and stamping.

Figure 1B:
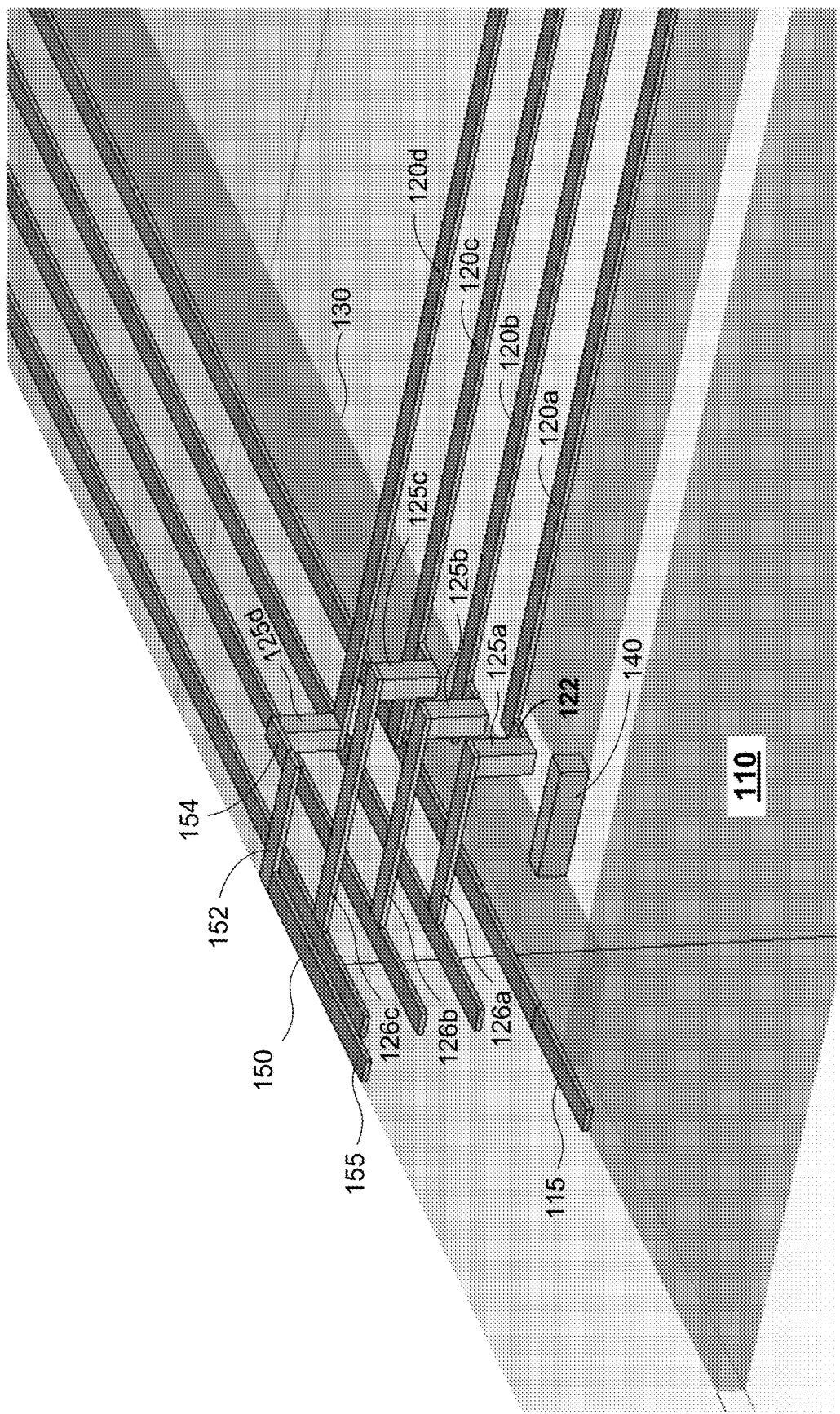

FIG. 1B shows the portion of the PIC 110 with integrated antenna 120 labeled "1B" in FIG. 1A. Four layers 120a-d of the antenna 120 are shown for illustration. Each subsequent layer is directly or substantially directly over each preceding layer. For example, layer 120d is directly or substantially directly over each of the layers 120a, 120b and 120c. Each layer 120a-d may have one or more turns. Adjacent layers (e.g., 120a and 120b) are connected through an offset segment 122, a contact 125, and a linking segment 126. For example, layer 120a is connected to layer 120b by the offset segment 122, the contact 125a, and the linking segment 126a (which is actually in the second layer of the antenna 120). The offset segments 122 ensure that the linking segments 126a-c overlap with each other and allow placement of the contacts (and the formation of corresponding vias) that are offset from each other. For example, contact 125b is adjacent to the end of linking segment 126a by about a minimum spacing for such features according to the design rules for the manufacturing process. Linking segment 126a is connected to, in the same layer as, and formed at the same as antenna layer 120b (as is offset segment 122b, not labeled in FIG. 1B).

The uppermost layer 120d is connected to an upper antenna terminal 155 through a contact 125d, an optional offset segment 154, a linking segment 152 and a bridge 150. The offset segment 154, when present, can ensure that the linking segment 152 overlaps with the other linking segments 126a-c. In fact, the linking segment 152 is also optional, but it ensures that the bridge 150 overlaps the underlying antenna layers 120a-d. The lower antenna terminal 115 is essentially an extension of a segment of the first antenna layer 120a. When the bridge 150 overlaps the underlying antenna layers 120a-d, then either the upper antenna terminal 155 extends beyond the lower antenna terminal 115 (and is connected to the PIC 110 by a series of contacts similar to contacts 125a-d and pads comprising an isolated segment of the metal layer forming the corresponding offset segment, linking segment and antenna layer.

Stamping the substrate to form the opening 135 may also leave a link 140 to be cut later. The link 140 provides mechanical support for the substrate 130 after stamping, but before subsequent processing.

It some instances, it may be desirable to avoid cutting the link 140. For example, to avoid having to pattern the substrate, and thus avoid cutting the link 140, a compensation coil may be formed inside the antenna 120 to offset the electromagnetic effects of a metal or conductive substrate 130 near the antenna 120. The compensation coil can improve coupling and/or reduce eddy currents in the substrate 130.

Additionally or alternatively, a relatively large capacitor may be employed to provide a similar offset of the electromagnetic effects of the substrate 130. Use of a compensating coil having a relatively high Q may be particularly advantageous. Alternatively, a ferrite layer can be formed on the patterned or unpatterned substrate 130 prior to forming the antenna 120 (see, e.g., the second exemplary method discussed below and FIGS. 8A-D). However, if the ferrite layer is present, the substrate 130 need not be patterned, and it may be pre-stamped prior to application to the substrate 130 (e.g., by lamination in a roll-to-roll process).

A Second Exemplary Configuration

Figure 2:
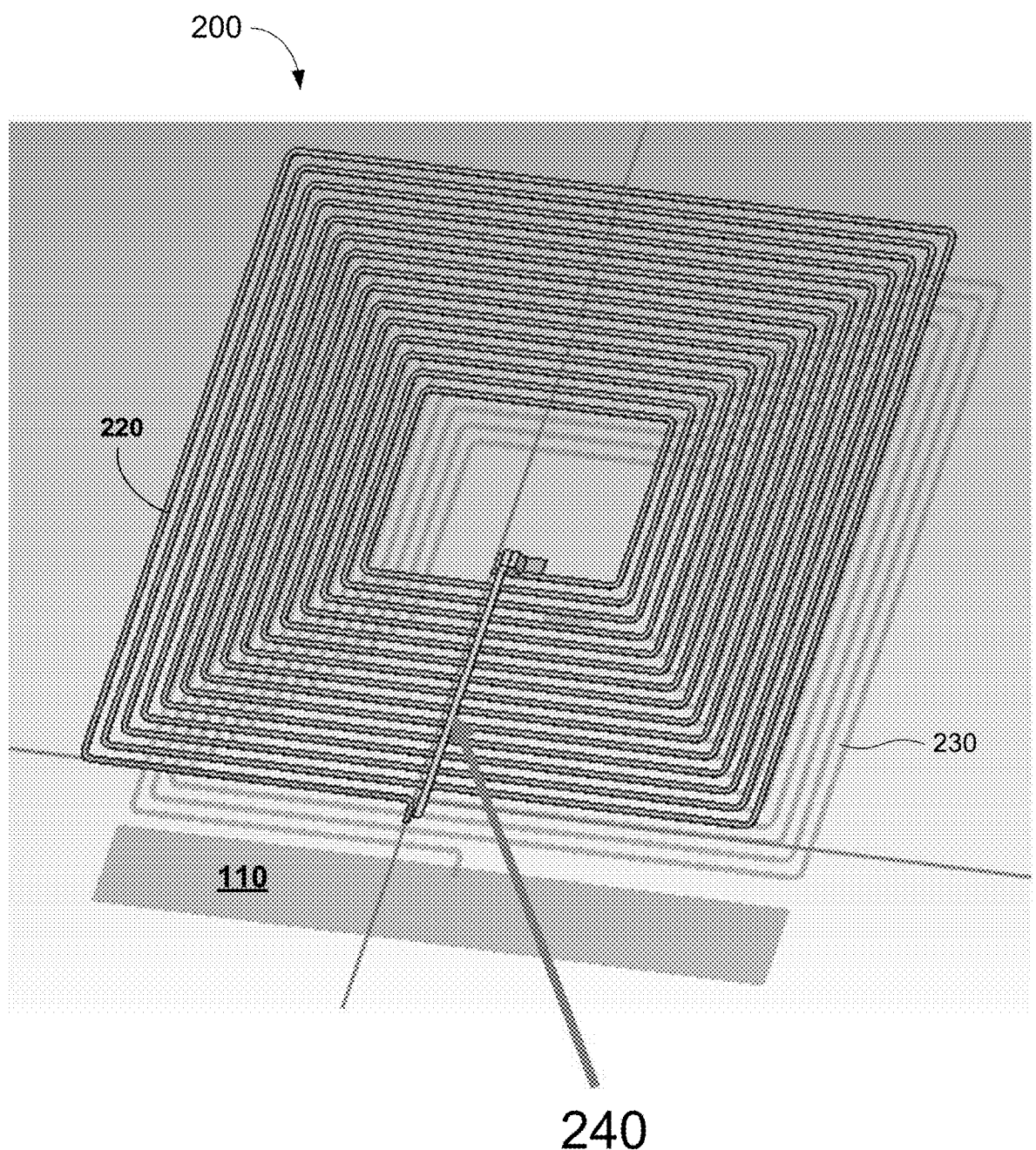
FIG. 2 is a diagram showing an exemplary printed and/or thin film integrated circuit (PIC) including an integrated antenna according to a second configuration.

FIG. 2 shows an exploded view of a second exemplary configuration 200 of the PIC 110 with an integrated antenna 220 in a planar spiral arrangement. The PIC 110 may be the same or substantially the same as the PIC 110 in FIGS. 1A-B, and the material of the substrate 230 (e.g., the unpatterned substrate) may be the same or substantially the same as the substrate 130 in FIGS. 1A-B.

The antenna 220 may be formed on the substrate 230 by stamping or by lithographic patterning and wet etching. Either process generates a 2D structure for the antenna 220 similar to the antenna 120 in the first configuration above. An intervening dielectric layer (not shown) is between the antenna 220 and the substrate 230. Due to the relatively narrow spacing between turns of the antenna 220, relatively high precision stamping may be necessary.

The bridge 240 can be fabricated after the stamping process is completed. Bridge fabrication after stamping may benefit from careful handling of the device 200 due to the lack of mechanical rigidity of the patterned substrate 230.

In variations of this configuration, bridge fabrication after stamping can be avoided. In one example, a compensation coil that capacitively couples to the antenna 220 can avoid a need to stamp the substrate 230 under the antenna coil 220. In another example, a ferrite layer can be formed on the unpatterned substrate 230 prior to forming (e.g., printing) the antenna 220 (see, e.g., the second exemplary method discussed below and FIGS. 8A-D).

A Third Exemplary Configuration

Figure 3:
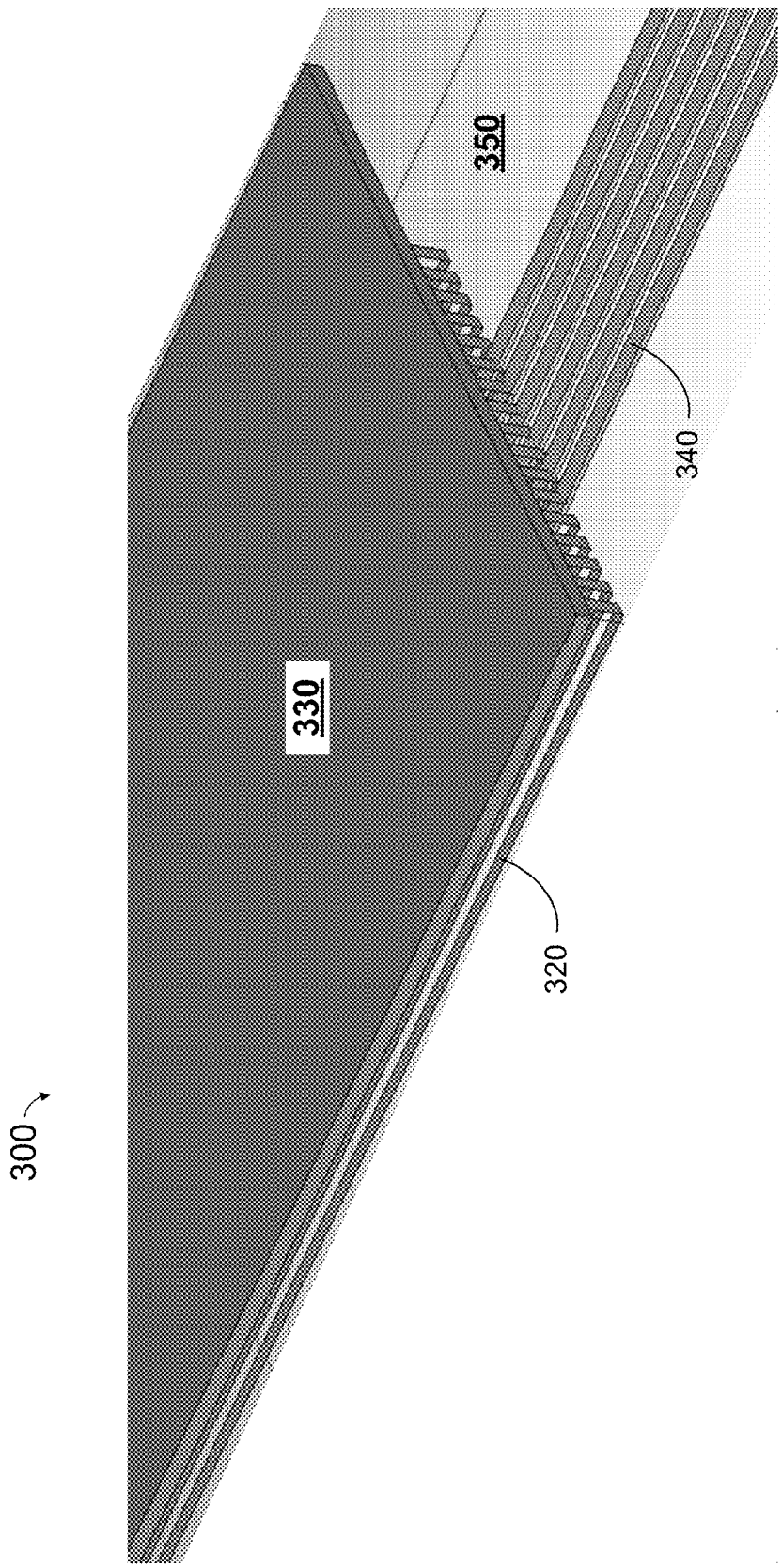
FIG. 3 is a diagram showing an exemplary printed and/or thin film integrated circuit (PIC) including an integrated antenna according to a third configuration.

FIG. 3 shows a third exemplary configuration 300 of a PIC (not shown) on a substrate 330 with an integrated antenna 320 having a 3D spiral structure with the rotation axis parallel to the substrate 330. The PIC is on the surface of the substrate 330 (which may comprise a metal substrate with a barrier layer and/or a dielectric layer thereon as disclosed herein) facing away from the viewer. The traces in the antenna 320 may alternate in different layers of metal. In other words, a first long antenna trace may be in a first layer of metal, and the second long metal trace(s) to which it is connected may be in a second, higher layer of metal. The second long metal trace(s) are further connected to third long metal traces in the first layer of metal, laterally adjacent to the first metal trace. The long traces in different layers of metal are connected to each other through offset segments and contacts, as shown in FIG. 1B.

The 3D spiral antenna 320 magnetically couples to a secondary antenna 340 on a separate substrate 350. The substrate 350 may comprise a thin sheet of a flexible insulating material, such as PET, PE, PP or a copolymer or blend thereof. The secondary antenna 340 receives and transmits signals wirelessly to a reader (not shown). The 3D spiral antenna 320 may increase the read range of the secondary antenna 340 and/or enable a reduction in the size of the secondary antenna 340.

Ensuring that adequate and/or sufficient coupling is available in this configuration may require some care in its design and manufacture. While the effective flux area of the antenna 320 may be relatively small (e.g., on the order of 0.5-50 mm2; a length of 2-25 mm by a height of 0.1-2 mm, and in one example, about 3 mm2), a layer of high permeability material (e.g., between the antennas 320 and 340) may increase the flux or flux density. The effect of a steel or other metal substrate may be moderate relative to other configurations disclosed herein.

A Fourth Exemplary Configuration

Figure 4:
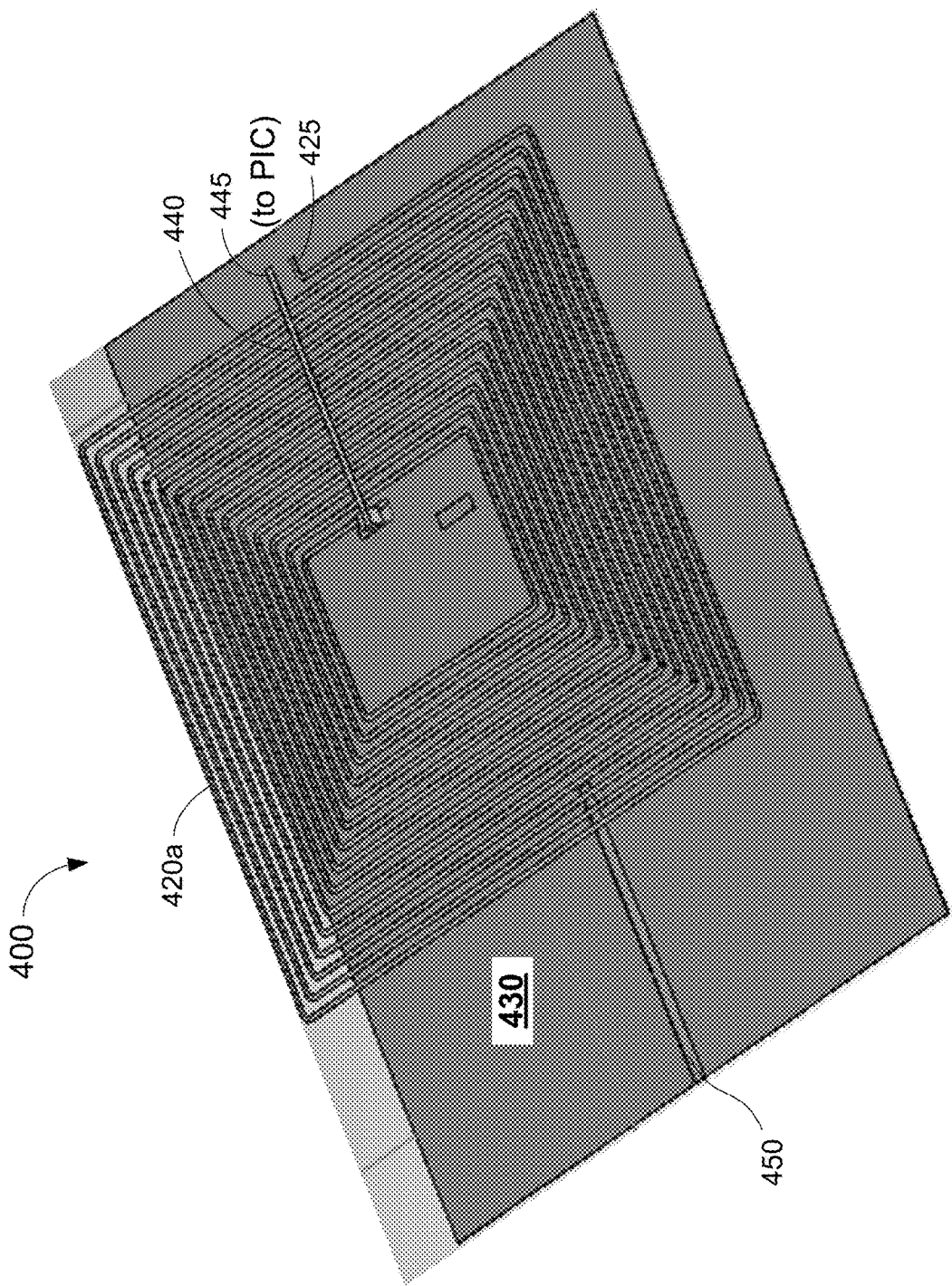
FIG. 4 is a diagram showing an exemplary printed and/or thin film integrated circuit (PIC) including an integrated antenna according to a fourth configuration.

FIG. 4 shows a fourth exemplary configuration 400 of a PIC (not shown) with an integrated antenna 420 having a 2D spiral structure and one or more slits 450 in the substrate 430. The slit(s) 450 may induce controlled eddy currents in the substrate 430, thereby controlling (e.g., negating) adverse electromagnetic effects of the metal substrate 430 near the antenna 420. In certain optimized embodiments, the eddy currents in the metal substrate 430 induced by the slit(s) 450 may enhance the read range and/or sensitivity of the antenna 420.

The PIC (not shown) and material for the substrate 430 (e.g., the unpatterned substrate) may be the same or substantially the same as in previous embodiments. The pattern and material of the antenna 420 may be the same or substantially the same as the antenna 220 in FIG. 2. The bridge 440 may be the same or substantially the same as the bridge 240 in FIG. 2. The lower and upper terminals 425 and 445, respectively, may be similar to the lower and upper terminals 115 and 155 in FIG. 1 and the same as the lower and upper antenna terminals (not labeled) in FIG. 2.

Care should be taken when stamping the substrate 430 to form slit(s) 450 that do not overlap with the long traces of the spiral antenna 420. Furthermore, design criteria should be carefully considered when creating a slit 450 that does not overlap with a trace of the spiral along the length of the trace, but that still provides sufficient coupling to the main antenna 420.

A Fifth Exemplary Configuration

Figure 5A:
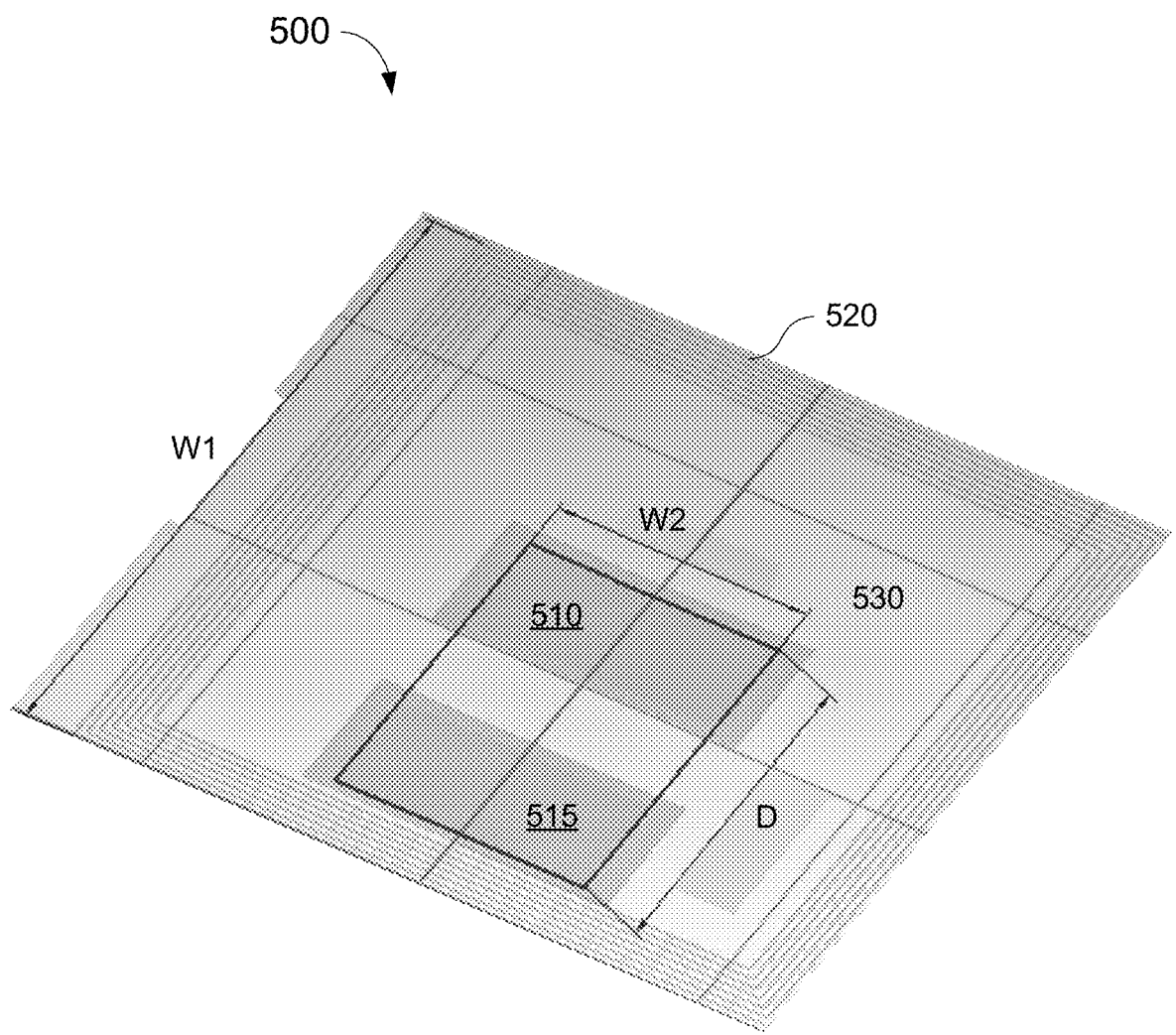
FIGS. 5A-B are diagrams showing exemplary printed and/or thin film integrated circuits (PICs) including an integrated antenna according to a fifth configuration.

FIG. 5A shows a fifth exemplary configuration 500 of a PIC 510 with a secondary antenna 520 that communicate with each other through capacitive coupling. The capacitance for communication between the antenna 520 and the PIC 510 takes place between one or more PIC pads (not shown) and one or more antenna pads 515. The PIC pad(s) are (i) relatively large, (ii) positioned close to the antenna pad(s) 515 (e.g., with a small gap between them), and (iii) electrically connected to the PIC 510 by one or more traces or wires. The PIC 510 does not include a separate antenna. The PIC pads may also be characterized as or take the form of a "PIC antenna." There is no physical electrical connection (e.g., wire) between the antenna 520 and the PIC 510.

Typically, the antenna 520 includes aluminum (Al) on a plastic substrate, such as polyethylene terephthalate (PET). Such a configuration may be used in conjunction with a relatively large antenna 520 fabricated on a plastic substrate 530. For example, the antenna 520 may have a width W1 of from 15 mm to 50 mm and a length (dimension perpendicular to the width W1) of from 20 mm to 75 mm, although this configuration is not so limited. The PIC 510 may have a width W2 of from 1 to 25 mm and a length of from 2 to 10 mm, and the antenna pad 515 may have a width and a length within the ranges given for the PIC 510, although the dimensions of the PIC 510 and antenna pad 151 need not be the same or similar.

The PIC pads and antenna pads are generally configured to ensure sufficient signal integrity during load modulation. It may be important to control variations in coupling capacitances due to alignment errors, substrate (e.g., PET) thicknesses (or thickness variations), and variations in the dielectric constant of materials between the antenna pads and the PIC pads.

Figure 5B:
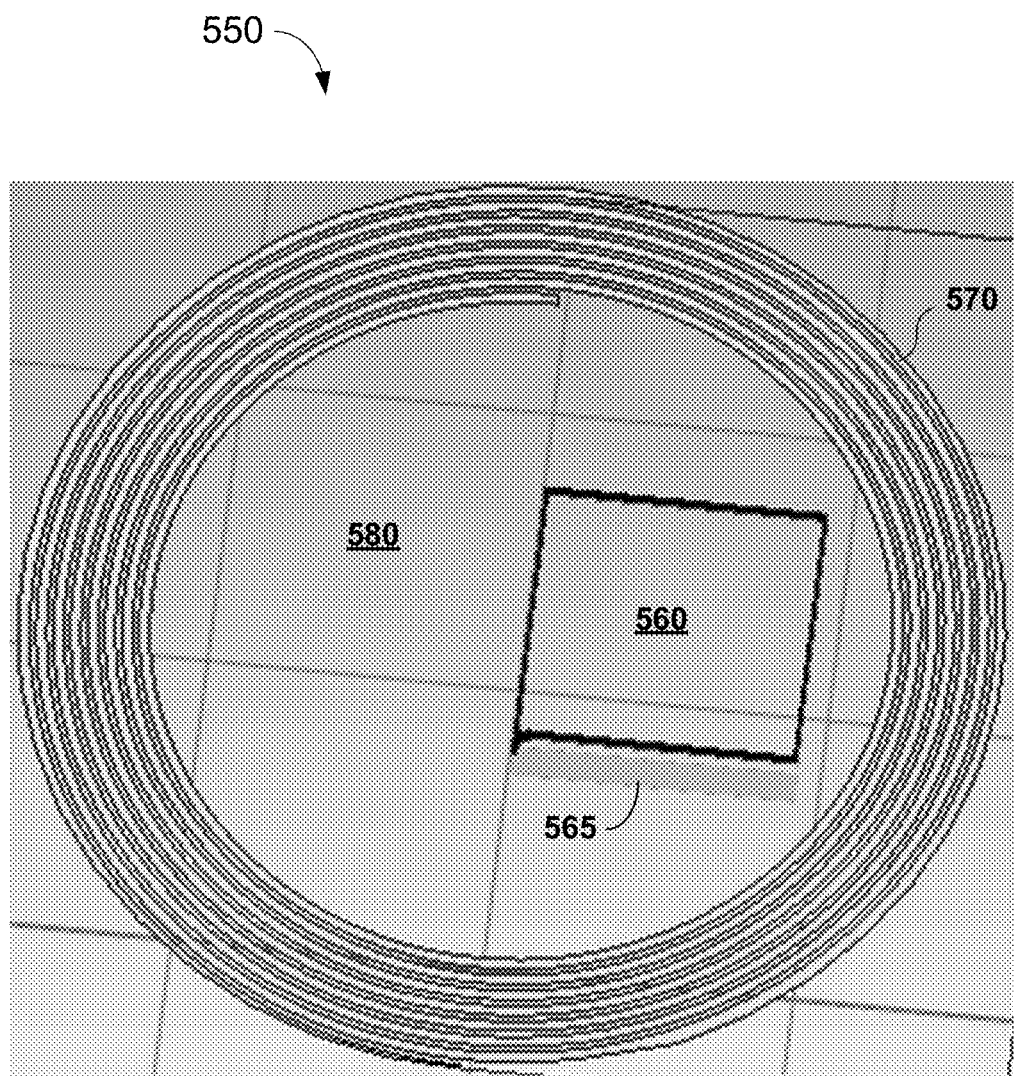

FIG. 5B shows a variation 550 of the configuration 500 in FIG. 5A, in which a PIC 565 on a first substrate is magnetically coupled to an antenna 570 on a separate substrate 580. The PIC 565 is connected to an antenna 560 that communicates with the antenna 570 through magnetic coupling. The antenna 570 in this variation 550 is circular or round. As for the configuration 500 in FIG. 5A, and there is no physical electrical connection between the antenna 570 and the PIC antenna 560. The antenna 570 may have a diameter within the ranges given for the length and width of the antenna 520 in FIG. 5A.

A Sixth Exemplary Configuration

FIG. 6 shows a sixth exemplary configuration 600 of a PIC 610 with an integrated antenna 620 similar to the configuration 100 in FIG. 1A or 200 in FIG. 2, but in which the substrate 630 includes a two-dimensional array of metal elements 640, formed by selective removal of area(s) of the substrate 630 surrounding the metal elements 640. The array of metal elements 640 maintains the mechanical rigidity of the substrate (e.g., in combination with the frontside lamination disclosed with respect to the first configuration above), but breaks or disrupts the eddy current(s) in the substrate. However, if the separation between the metal elements 640 is too large or is otherwise insufficient to maintain a desired or predetermined level of mechanical rigidity, the spacing between adjacent metal elements 640 can be reduced.

The array of metal elements 640 may be regular (e.g., in rows and columns, in which adjacent metal elements 640 are equally spaced apart), offset (e.g., adjacent rows and/or columns may be displaced by up to 50% of the distance between adjacent metal elements 640), or irregular (e.g., random). For example, each metal element 640 may have a diameter D, or a width and length, of from 10 μm to 1 mm. In a regular or offset array, the spacing S between adjacent elements may be from 100 μm to 5 mm. However, the configuration is not limited to these ranges of values.

The metal elements 640 may be formed by low-resolution photolithographic patterning using a dry etch or wet etch. However, wet etching a metal substrate 630 could result in processing and/or reliability issues.

Exemplary Parameters

Typically, the antenna is made using an electrically conducting material. For example, the antenna may comprise aluminum, an aluminum alloy, a tungsten-aluminum (W/Al) or titanium-aluminum (TiAl) bilayer, copper, silver, etc., and may be formed by direct printing or by printing a seed layer (e.g., of palladium or another printable seed metal) and either electroplating or electrolessly plating a bulk metal such as aluminum of copper thereon. The antenna may have a thickness of 1-100 μm, although the invention is not limited to this range of thicknesses.

In embodiments using contacts (e.g., to connect different layers of the antenna or to connect the antenna terminals to a metallization layer in the PIC), a via is formed in one or more insulator or dielectric layers. Such vias may have a size (e.g., a diameter, or length and width dimensions) of from 0.1 mm to 3 mm, although the invention is not limited to such dimensions. Such vias can include through vias and blind vias.

The PIC may have a maximum thickness of 5 mm, or any maximum value less than 5 mm (although the invention is not limited to such a maximum thickness). Such a maximum thickness can ensure compatibility with existing processing and application (e.g., labelling) equipment, as well as compliance with certain form requirements (e.g., for bar code labels) and/or standards. The maximum thickness of the PIC may be particularly important in embodiments that include a 3D (or solenoid-type) antenna, as discussed herein (see, e.g., the third configuration above).

A First Exemplary Method

FIGS. 7A-E show intermediate and final structures in an exemplary method of making a thin film and/or printed integrated circuit with an integrated antenna. The exemplary method of FIGS. 7A-E produces a PIC with an integrated 3D antenna coil, stamped in the middle of the substrate to remove accessible portion(s) of the substrate and reduce the electromagnetic effects of the substrate on the antenna.

Figure 7A:
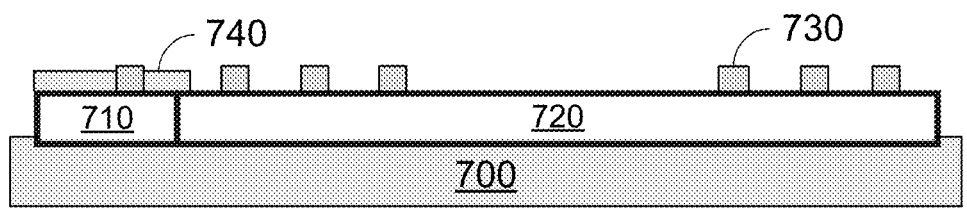
FIGS. 7A-D are diagrams showing an exemplary method for making a PIC with an integrated antenna according to embodiments of the present invention.

FIG. 7A shows a PIC 710 and a dielectric layer 720 on a substrate 700. The substrate 730 may comprise a metal substrate having properties sufficient to provide mechanical support during subsequent processing. The PIC 710 is made using a standard printed and/or thin film TFT flow (see, e.g., U.S. Pat. Nos. 7,687,327, 7,701,011, 7,767,520, 8,304,780, 8,884,765, 9,165,238 and 9,196,641 [the relevant portions of which are incorporated herein by reference). The dielectric layer 720 may comprise one or more conventional dielectric or insulator layers (e.g., a silicon oxide, silicon nitride, bilayers and multi-layers thereof, a polymeric and/or plastic layer such as polyethylene, polypropylene, polystyrene, polyimides, polyacrylates, polymethacrylates, copolymers and blends thereof, etc.). The antenna 730 may comprise a metal layer as described herein. The metal layer of the antenna may also be an uppermost layer of metal in the PIC 710. Passivation 740 is on or over only or substantially only the IC 710, and it may be selectively deposited, e.g., by printing.

Figure 7B:
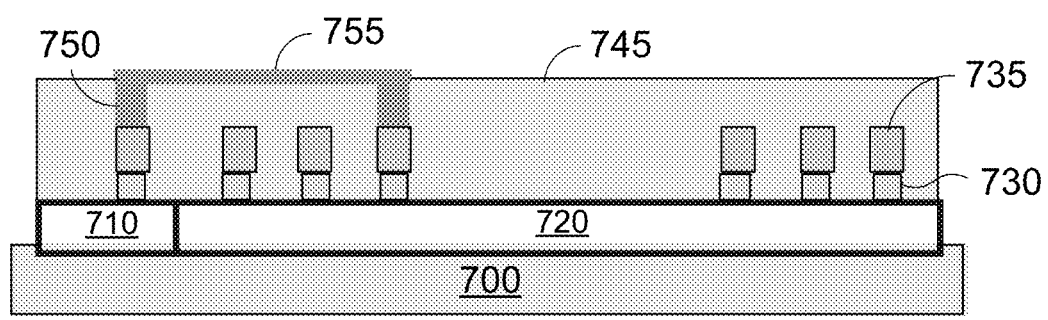

Referring now to FIG. 7B, a layer 735 of a second metal, such as copper, is plated on the metal layer 730. A second dielectric 745 is coated or laminated on or over the structure including the second metal layer 735. A plurality of vias are formed in the second dielectric 745 (e.g., by laser irradiation or ablation). Typically, one via is formed to expose each of the uppermost metal layer of the PIC 710 and the inner terminal of the antenna 730 to be connected to each other. (The outer terminal of the antenna 730 may be directly connected to the PIC 710 through the uppermost metal layer, which is common or shared by both the PIC 710 and the antenna 730.) A strap 755 is formed on the second dielectric 745 (e.g., by printing or other selective deposition technique). This also forms contacts 750 in the open vias. Formation of the copper layer 735, the second dielectric 745, the contacts 750 and the strap 755 is similar or identical to, and thus able to leverage, a conventional PCB flow. However, the substrate and at least some of the structures thereon (i.e., the PIC 710) may be different from the conventional PCB flow.

Figure 7C:
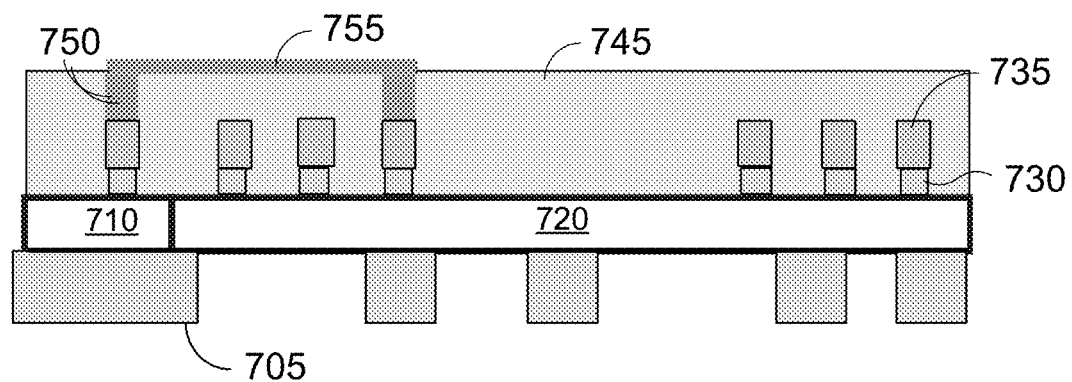

Referring now to FIG. 7C, the substrate 700 is patterned (e.g., by stamping or low-resolution lithography). If lithography is used, lithographic patterning of the substrate 700 is followed by etching (e.g., selective wet etching or dry etching). The patterned and etched substrate 705 includes tabs (e.g., for structure or mechanical support, for linking adjacent PICs 710 and antennas 730/735 formed simultaneously on the unpatterned substrate 700, etc.). The patterned substrate may form a support web or mesh-like structure under the PIC 710 and the antenna 730 (see, e.g., FIG. 7E). In some embodiments, the frontside (i.e., the surface having the second dielectric 745 and the strap 755 exposed thereon) may be laminated prior to patterning the substrate. In other or further embodiments, the patterned substrate 705 may completely support (e.g., remain intact below) the PIC 710 and/or the antenna 730/735. However, in such embodiments, the mechanical support provided by the patterned substrate 705 should be balanced against any adverse electromagnetic effects of the patterned substrate 705.

Figure 7D:
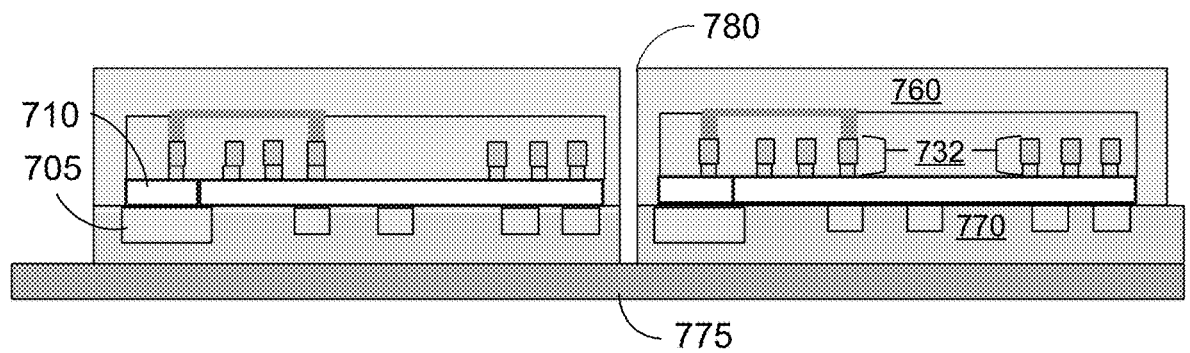

Referring now to FIG. 7D, the structure in FIG. 7C is converted to a wet inlay (e.g., a structure suitable for further use, such as application as a label onto a package or container, such as a box, an envelope, or a bottle). In the embodiment shown in FIGS. 7C-D, lamination 760 (e.g., with plastic such a polypropylene [PP] or other plastic disclosed herein, paper having an adhesive thereon, etc.) is formed on the frontside of the structure. An adhesive 770 is deposited or otherwise formed on or over the patterned substrate 705, then a liner 775 is placed on the adhesive 770. The liner 775 may comprise a plastic or paper sheet, a metal foil, laminates thereof, etc. A cut 780 is made between adjacent dies (i.e., PICs 710 integrated with the plated antennas 732) using a punch. The punch may be aligned using an alignment mark (e.g., one or more geometric indentations, such as a semicircle, triangle, square, rectangle, etc., along one or more edges of the substrate 705 and/or liner 775). Any tabs in the patterned substrate 705 between adjacent dies may be cut in this process. Thereafter, the PICs 710 with integrated antennas 732 may be singulated, either before or at the time of application. This process may be similar or identical to a conventional label conversion process (e.g., no pick-and-place process for attaching the antenna to the PIC is necessary), but the substrate and at least some of the structures thereon (i.e., the PIC 710 and integrated antenna 732) are different from the conventional label conversion process.

Figure 7E:
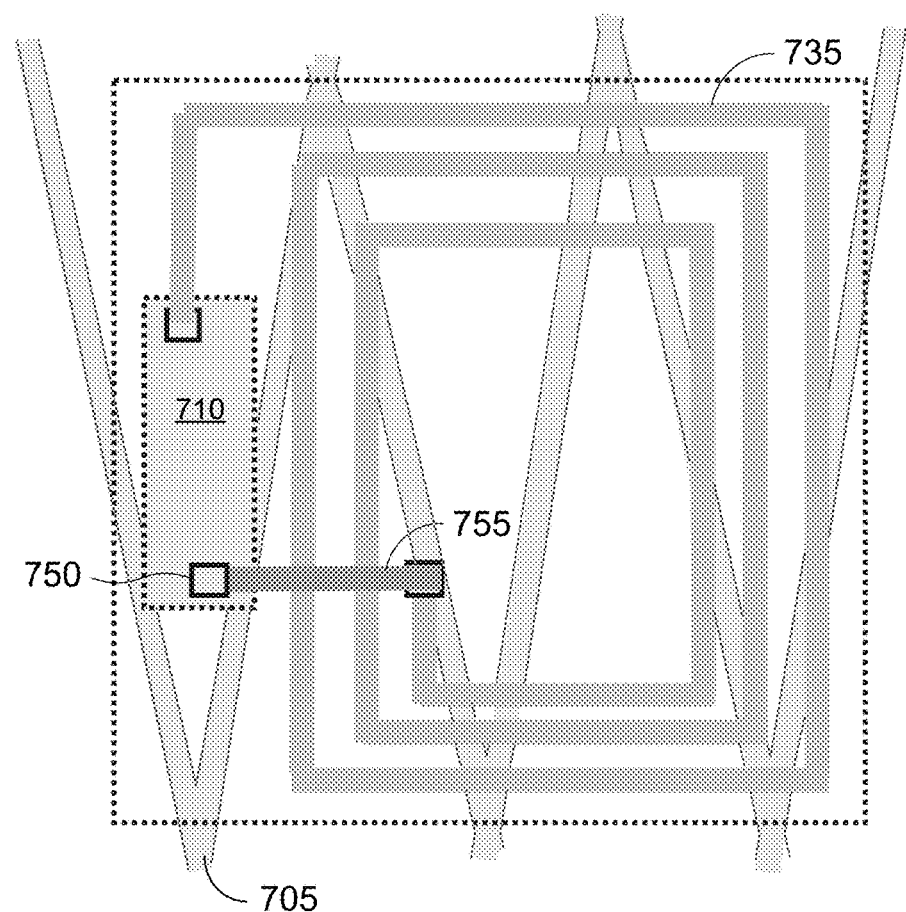
FIG. 7E is a plan view of the conductive and/or electrically active structures of the PIC and integrated antenna made by the method of FIGS. 7A-D.

FIG. 7E is a plan view of the conductive and/or electrically active structures in FIG. 7D. The printed IC 710 and integrated antenna 735 (only the copper layer is visible in the plan view) are over the patterned substrate 705. The strap 755 connects the inner terminal of the antenna 735 to the IC 710. Benefits of the PIC-and-integrated-antenna manufacturing approach shown in FIGS. 7A-E include ease of manufacturing (e.g., using well-known industrial technology, such as PCB processing, wet etching, label conversion, etc.). The approach shown in FIGS. 7A-E also eliminates most metal (such as stainless steel) from the substrate and reduces or eliminates the adverse electromagnetic effects of the substrate on the antenna, thereby improving product performance.

New steps in the method shown in FIGS. 7A-E include making the patterned substrate 705 and making the cut in the patterned substrate 705 after fabrication and stamping. When the substrate 700 comprises steel (e.g., stainless steel), there may be issues related to disposal of the used etchant after wet etching the substrate. There may also be costs for "label conversion" (e.g., ensuring [i] compliance with labeling forms and/or standards, and/or [ii] compatibility with existing labeling equipment).

Devices have been made on steel and other metal substrates, and such steel and other metal substrates are known to be wet-etchable. Thus, the present process is manufacturable, and is expected to capable of high-volume commercial production.

A Second Exemplary Method

FIGS. 8A-E show another exemplary method of making a thin film and/or printed integrated circuit with an integrated antenna. The exemplary method of FIGS. 8A-E forms a 2D spiral antenna structure on a ferrite layer. The method of FIGS. 7A-E generates a similar antenna structure, but includes a stamping step, which is generally avoided in the method of FIGS. 8A-E (except for singulation, after the inlay manufacturing process is complete).

Figure 8A:
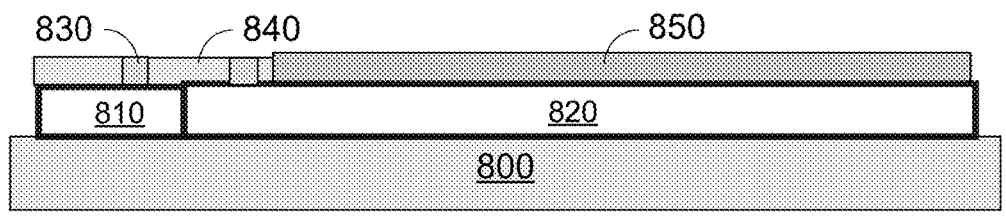
FIGS. 8A-C are diagrams showing another exemplary method for making a PIC with an integrated antenna according to embodiments of the present invention.

FIG. 8A shows a PIC 810 and a dielectric layer 820 on a substrate 800. An uppermost layer of metal 830 and a passivation layer 840 is on the PIC 810 and optionally on part of the dielectric layer 820. A ferrite layer 850 is on the dielectric layer 820. The substrate 800, the PIC 810, the dielectric layer 820, the metal layer 830 and the passivation layer 840 is similar to or the same as the substrate 700, the PIC 710, the dielectric layer 720, the metal layer 730 and the passivation layer 740 explained above with regard to FIG. 7A. The ferrite layer 850 may be pre-stamped (e.g., to predetermined dimensions and/or to be aligned in a predetermined position and/or manner), may comprise a soft ferrite (see, e.g., U.S. Pat. Appl. Publ. No. 2017/0040665, now U.S. Pat. No. 9,947,988, the relevant portions of which are incorporated herein by reference), may be selectively deposited (e.g., printed, extruded, etc.), and may function as a second passivation or a type of electromagnetic shield. Alternatively, the ferrite layer 850 may be blanket-deposited (e.g., by [spin-]coating, blade coating, roller coating, roll-to-roll lamination of a continuous ferrite sheet or film, etc.), and stamped after deposition (e.g., to form openings over the PIC 810). Although part of the metal layer 830 forming the antenna is outside the ferrite layer 850, such an antenna pattern is not required.

Figure 8B:
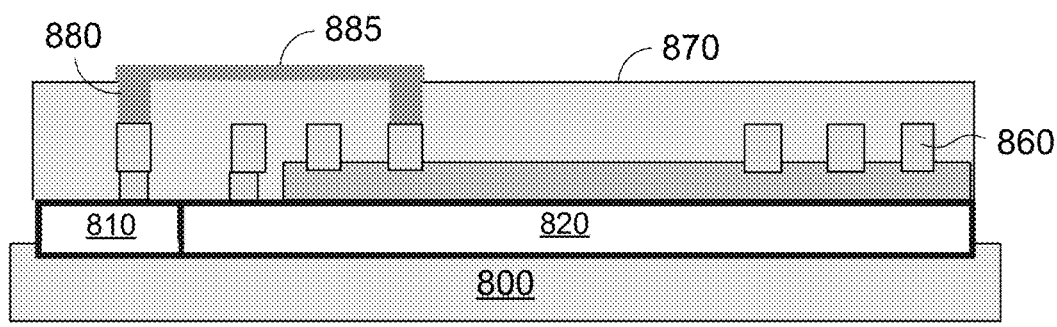

Referring now to FIG. 8B, a seed pattern for the antenna is printed on the ferrite layer 850. The seed pattern for the antenna can be printed in accordance with U.S. Pat. No. 8,066,805, the relevant portions of which are incorporated herein by reference. A copper layer 860 is plated on the printed seed layer and the metal layer 830. A dielectric layer 870 is coated or laminated on the resulting structure, similarly or identically to the dielectric layer 745 described with regard to FIG. 7B above. Vias are formed the dielectric layer 870 and the contacts 880 and strap 885 are printed in the vias and on the dielectric layer 870 as described with regard to FIG. 7B above.

Figure 8C:
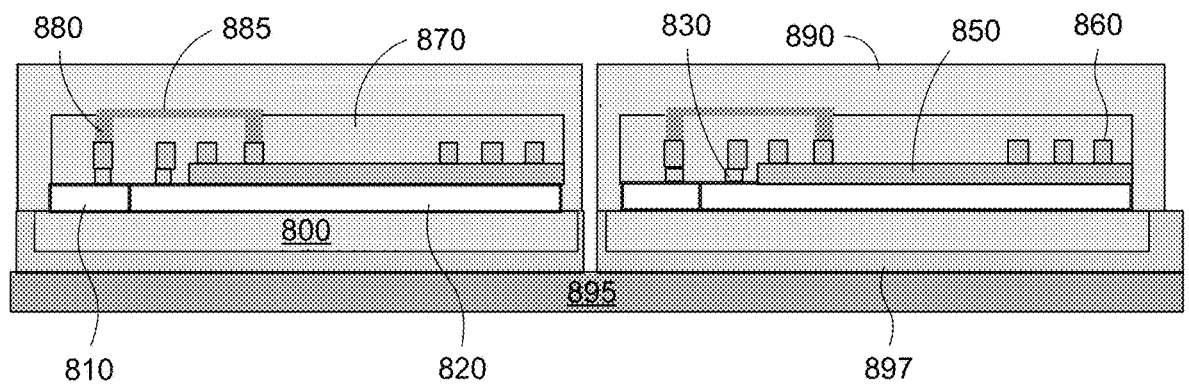

Referring now to FIG. 8C, the structure shown in FIG. 8B is converted to a wet inlay as described with regard to FIG. 7C-D above. The wet inlay is die cut with a punch as described with regard to FIG. 7D above. The metal substrate 800 does not require processing, as any effect it might have on the antenna 860 is reduced or minimized by the ferrite layer 850.

Figure 8D:
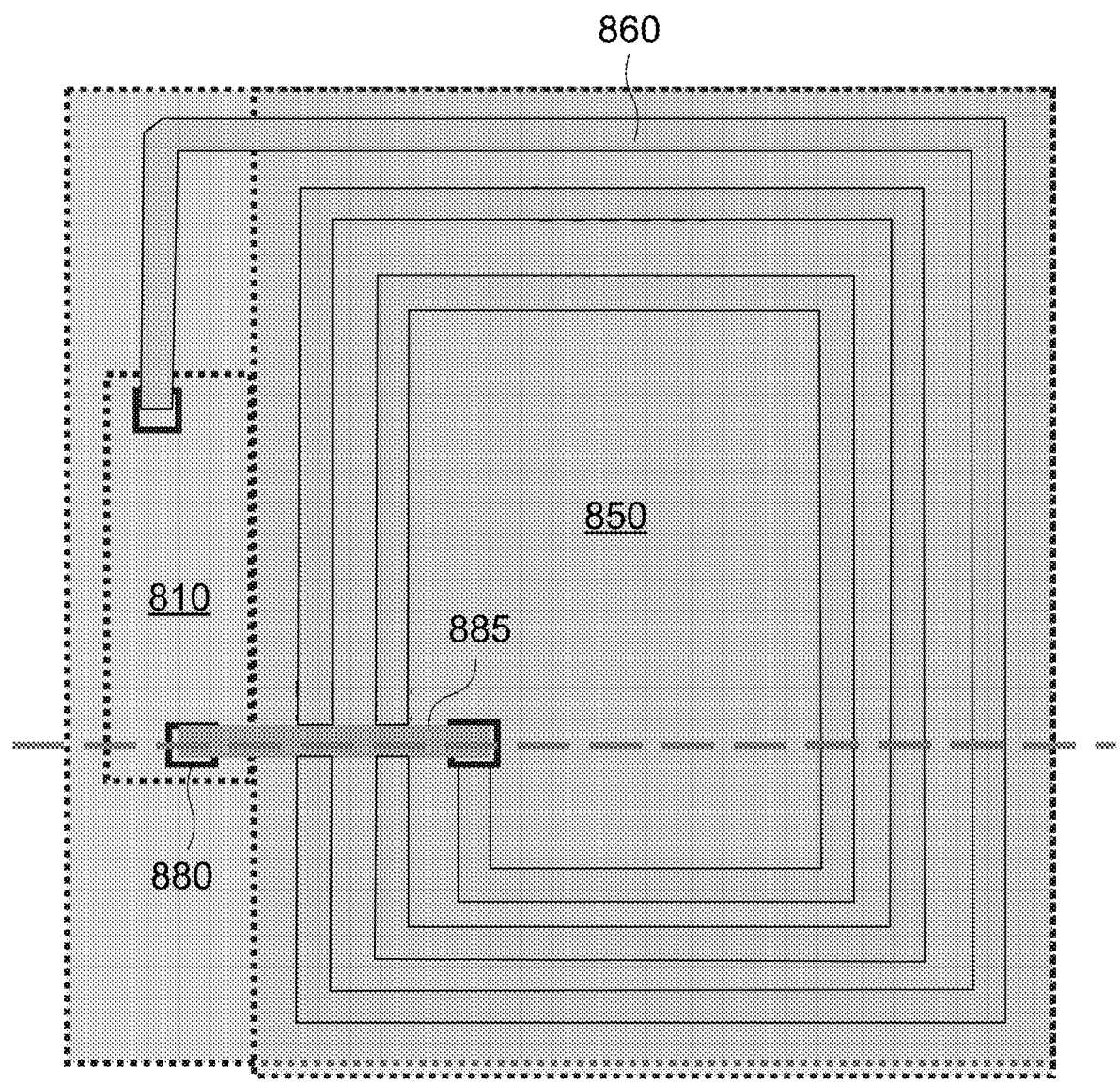
FIG. 8D is a plan view of the conductive and/or electrically active structures of the PIC and integrated antenna made by the method of FIGS. 8A-C.

FIG. 8D is a plan view of the conductive and/or electrically active structures in the wet inlay shown in FIG. 8C. The strap 885 connects contacts 880 (not shown in FIG. 8D) in the vias exposing the inner antenna terminal and the uppermost metal layer in the IC 810. As shown in FIG. 8D, the ferrite layer 850 can cover all or substantially all parts of the substrate to one side or edge of the IC 810. In addition to the benefits of the exemplary method shown in FIGS. 7A-E, the benefits of the exemplary method shown in FIGS. 8A-D include elimination of the metal substrate patterning steps (e.g., stamping and/or patterning and wet etching).

Furthermore, performance of the device exemplified in FIG. 8D is relatively insensitive to the position of the PIC pad (e.g., within ±1 mm from an optimum position), the resonant frequency of the PIC antenna, and/or the resonant frequency of the main antenna.

However, the method of FIGS. 8A-D fabricates the bridge or strap 885 after pre-stamping and applying (e.g., laminating) the ferrite layer 850. Furthermore, the read range of the antenna 860 may not be as high in the presence of the ferrite layer 850 as an otherwise identical product without the ferrite layer 850 between the substrate 800 and the antenna 860. Also, the performance of the ferrite layer 850 must be relatively high, similar to conventional ferrite shields and/or ferrite layers, to maximize its shielding effect. For example, a stainless steel substrate 800 introduces loss, even with ferrite shielding (i.e., the presence of a 200 μm-thick ferrite layer 850), resulting in a reduction in read range. Such losses and read range reductions can be mitigated at least in part by adding a spacer (e.g., between the ferrite layer 850 and the antenna 860, between the substrate 800 and the ferrite layer 850, etc.) or increasing the thickness of the ferrite layer 850.

A Third Exemplary Method

Figure 9A:
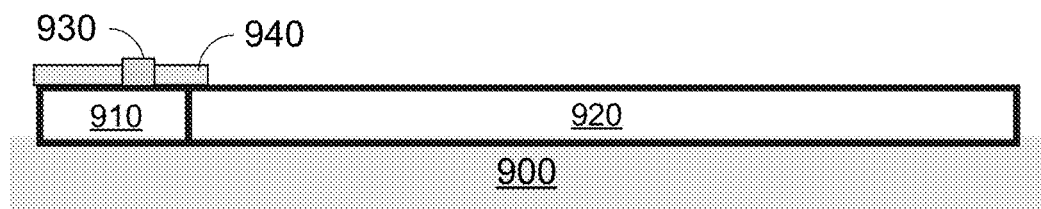
FIGS. 9A-E are diagrams showing yet another exemplary method for making a PIC with an integrated antenna according to embodiments of the present invention.

FIGS. 9A-F show another exemplary method of making a thin film and/or printed integrated circuit with an integrated antenna. In this exemplary method, the integrated antenna has an on-chip spiral structure with a center opening punched in the metal (e.g., steel) substrate. FIG. 9A shows a PIC 910 and a dielectric layer 920 on an unpatterned metal substrate 900, as described above with regard to FIGS. 7A and 8A. the PIC 910 has an uppermost metal layer 930 and a passivation layer 940 thereon, as explained above with regard to FIGS. 7A and 8A. For example, the top or uppermost metal layer 930 on the IC 910 may comprise or consist essentially of a tungsten-aluminum (e.g., W on Al, or "W/Al") bilayer, formed as described herein. However, the uppermost metal layer 930 may be formed only on or over the PIC 910, and very little or not at all in other areas of the substrate 900.

Figure 9B:
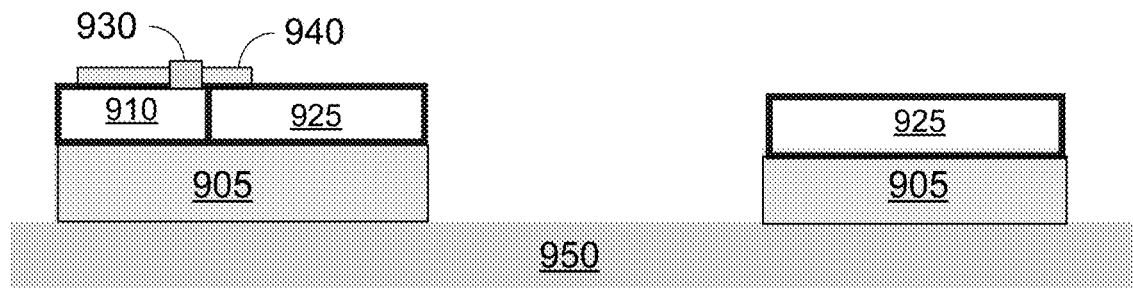

Referring now to FIG. 9B, the substrate 900 is laminated as described with regard to FIG. 7D. Thereafter, a hole or opening is punched or stamped in the metal substrate to form an open substrate 905. Alternatively, the hole or opening could be formed in the substrate by wet etching, with or without lithographic patterning.

Figure 9C:
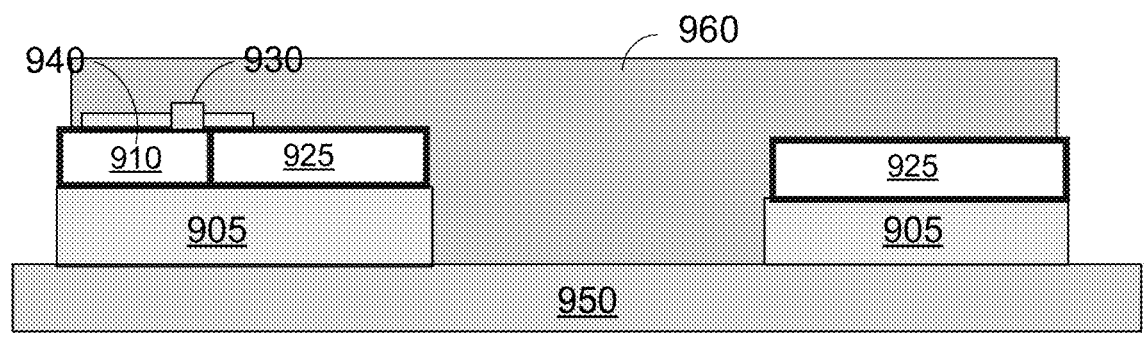

Referring now to FIG. 9C, an interlayer dielectric (ILD) and/or passivation layer 960 is printed, extruded or coated onto the structure in FIG. 9B. The hole or opening is filled using a conventional thin film gap-fill technique.

Figure 9D:
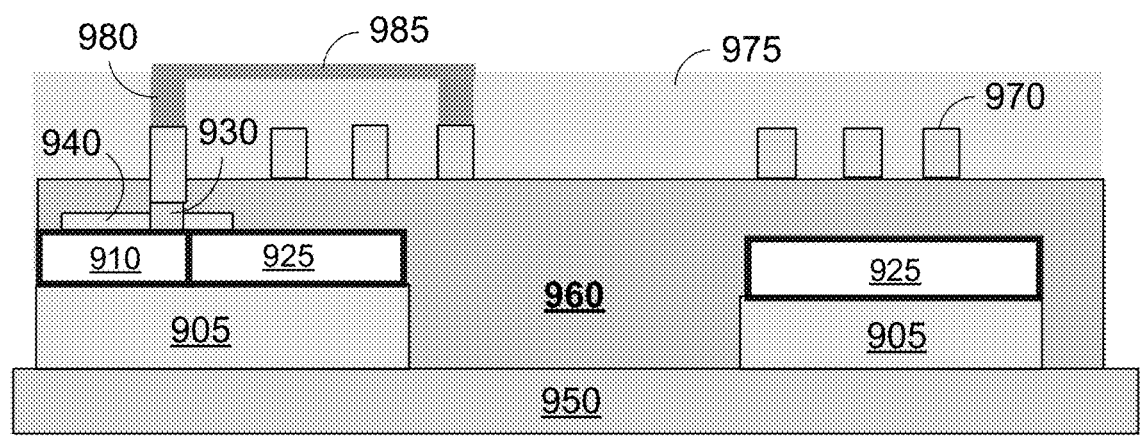

Referring now to FIG. 9D, a via is formed the dielectric/passivation layer(s) 960. The antenna may be printed as described herein, or optionally (and as shown), a seed layer may be printed and a copper layer 970 may be plated on the seed layer and any exposed metal layer on or over the PIC 910. A second dielectric layer 975 is coated or laminated onto the resulting structure, and vias are formed therein to expose the inner antenna terminal and the uppermost metal layer in the IC 910, as described with regard to FIGS. 7B and 8B above. Contacts 980 and strap 985 are printed in the vias and on the dielectric layer 975 as described with regard to FIG. 7B above, similarly or identically to a conventional PCB flow. However, the open substrate 905 and at least some of the structures thereon (e.g., the PIC 910, antenna 970, metal, contact and strap structure 930/970/980/985, etc.) are different from the conventional PCB flow.

Figure 9E:
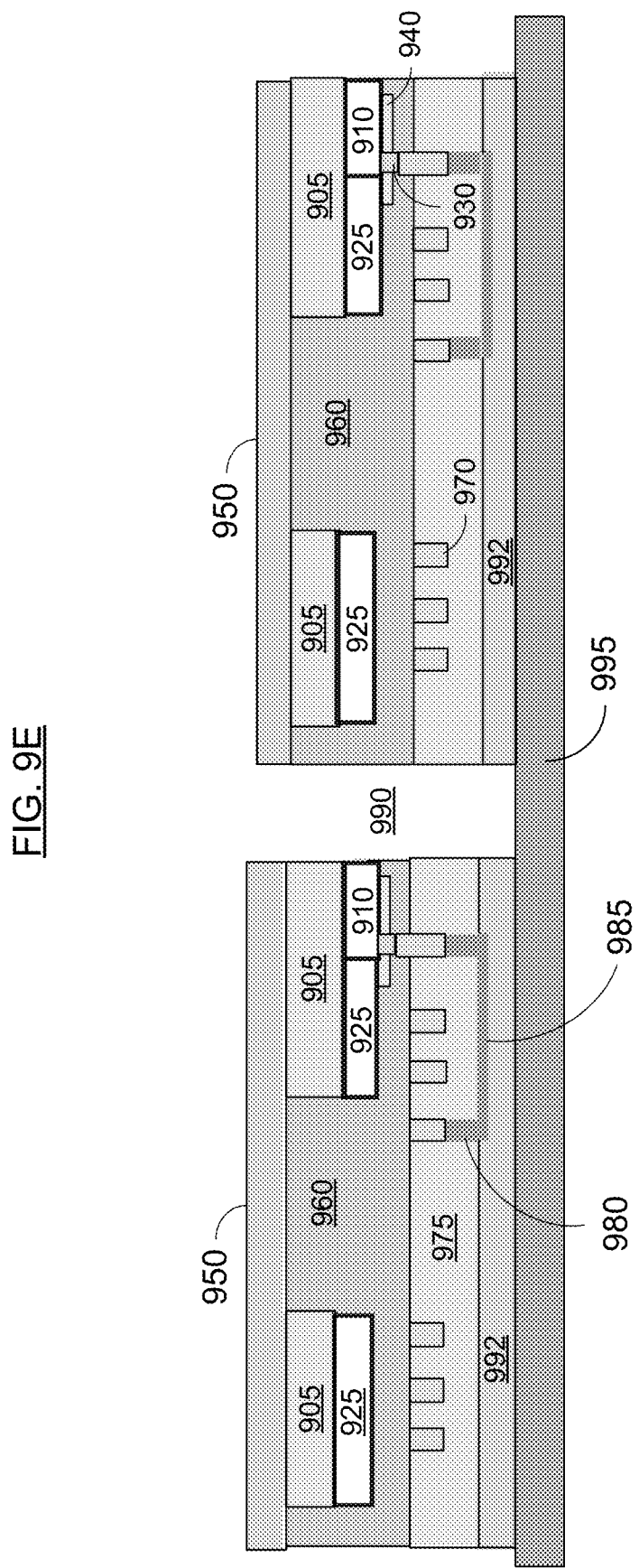

Referring now to FIG. 9E, the structure shown in FIG. 9D is converted to a wet inlay as described with regard to FIGS. 7C-D above. The dies are cut as described herein to form an opening 990 between adjacent dies, and the dies are singulated to remove any tabs between them as described herein. This process may be similar or identical to a conventional label conversion process (e.g., no pick-and-place process for attaching the antenna to the PIC is necessary), but the substrate and at least some of the structures thereon (e.g., as described in the preceding paragraph) are different from the conventional label conversion process.

Figure 9F:
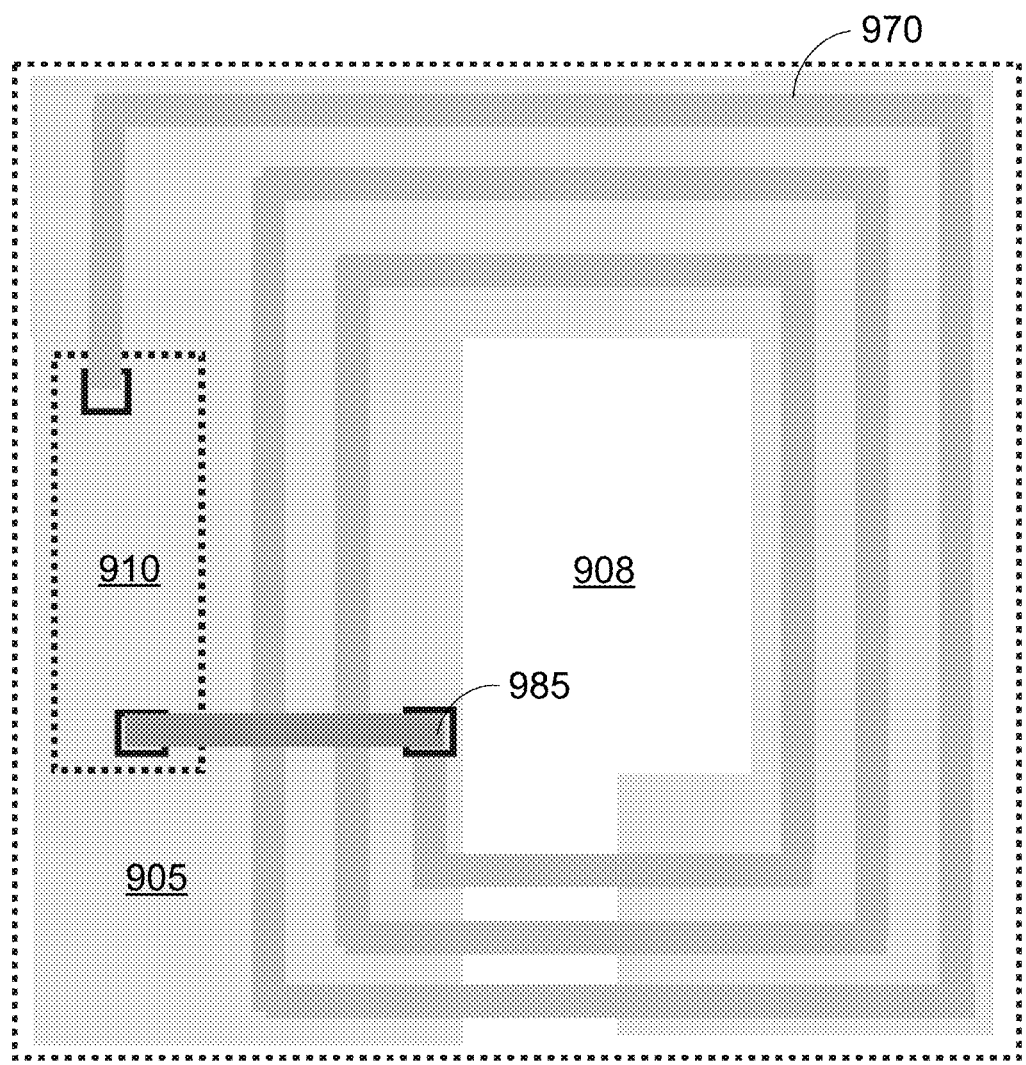
FIG. 9F is a plan view of the conductive and/or electrically active structures of the PIC and integrated antenna made by the method of FIGS. 9A-E.

FIG. 9F is a plan view of the conductive and/or electrically active structures in the device shown in FIG. 9E. The strap 985 connects contacts 980 (not shown in FIG. 9F) in the vias exposing the inner antenna terminal and the uppermost metal layer in the IC 910. As shown in FIG. 9F, the substrate 905 has a large opening 908 therein, including under rings or loops of the antenna 970. Benefits of the exemplary methods shown in FIGS. 9A-F include omission of any wet etch of the metal substrate, and ease of manufacturing (e.g., using well-known industrial technology, such as PCB processing, label conversion, etc.).

However, in such a method, the tooling for the punch operation may benefit from optimization for the area to be removed (e.g., the resolution), pressure to be applied, depth of the punch into the substrate, etc. However, recipes for similar punch operations and lamination for such devices are known. Backfilling the gap or opening in the substrate after punching also adds at least one step to the manufacturing process.

However, magnetic supporting arms (e.g., to hold and/or manipulate the substrate and/or the device[s] thereon) and punching processes for such metal substrates are known. Thus, the process exemplified in FIGS. 9A-F is manufacturable, and is expected to capable of high-volume commercial production.

A Fourth Exemplary Method

Figure 10A:
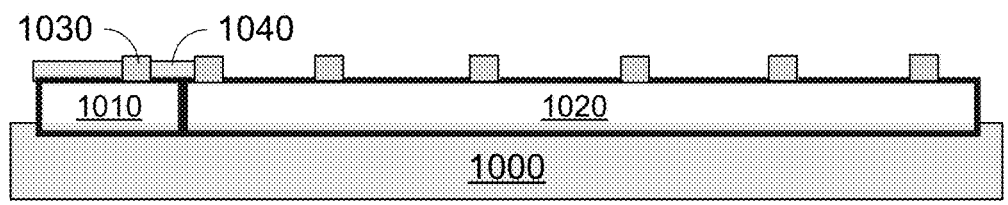
FIGS. 10A-C are diagrams showing another exemplary method for making a PIC with an integrated antenna according to embodiments of the present invention.

FIGS. 10A-D show another exemplary method of making a thin film and/or printed integrated circuit with an integrated antenna. In this method, the antenna has a 3D structure, with the turning axis parallel to the plane of the substrate. FIG. 10A shows a PIC 1010 and a dielectric layer 1020 on a substrate 1000. An uppermost layer of metal 1030 is on the PIC 1010 and the dielectric layer 1020. The uppermost layer of metal 1030 forms a lower layer of the antenna. A passivation layer 1040 is on the PIC 1010. The substrate 1000, the PIC 1010, the dielectric layer 1020, the metal layer 1030 and the passivation layer 1040 are similar to or the same as the substrate 700/800, the PIC 710/810, the dielectric layer 720/820, the metal layer 730/830 and the passivation layer 740/840 explained above with regard to FIGS. 7A and 8A. The metal layer 1030 may include offsets for connections to an overlying metal layer, as described herein. A tungsten-aluminum bilayer (W/Al) may be formed as described herein as the top or uppermost metal layer 1030 on the IC 1010.

Figure 10B:
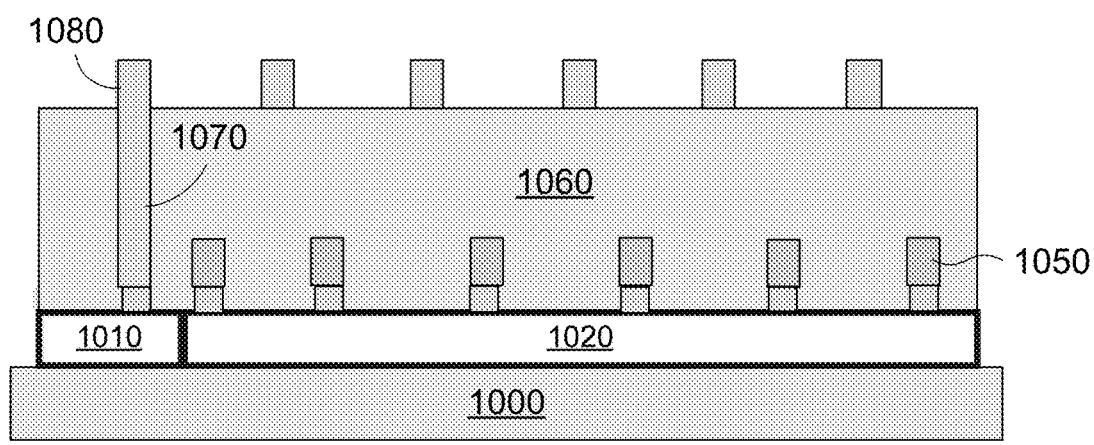

Referring now to FIG. 10B, a copper layer 1050 is plated on the metal layer 1030. This also forms copper-plated offsets 1055 (see FIG. 10D). A dielectric layer 1060 is coated or laminated on the resulting structure, similarly or identically to the dielectric layers 745 and 870 described with regard to FIGS. 7B and 8B above. The dielectric layer 1060 may have a thickness of 300-1000 or any value or range of values therein (e.g., ~500 μm), but the method is not limited to such values. Vias are formed the dielectric layer 1060, and a seed layer is printed on the dielectric layer 1060 and in the vias. The seed layer may comprise palladium or aluminum. A second copper layer 1080 is plated on the printed seed layer, which also forms contacts 1070 in the vias, thereby connecting the upper antenna layer 1080 to the lower antenna layer 1030/1050 (through the offsets 1055; see FIG. 10D).

Figure 10C:
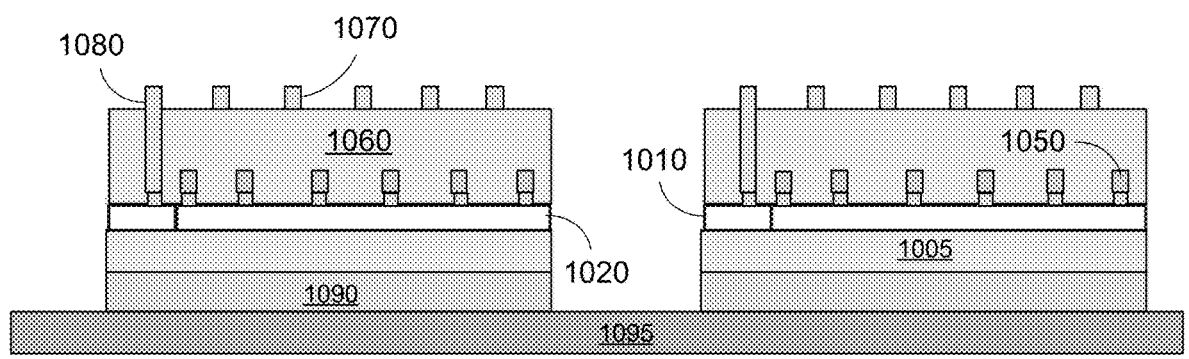

Referring now to FIG. 10C, the substrate 1000 is laminated as described with regard to the structure shown in FIG. 7D (e.g., to form an adhesive layer 1090 and liner 1095). Thereafter, a space is formed through the dielectric layers 1060 and 1020 and in the substrate 1000 (e.g., by punching or wet etching) to form the structure shown in FIG. 10C. The dice are then singulated, either before or during the application process. The singulated dice are placed onto (e.g., adhered to or mounted on) a secondary antenna on a separate insulating substrate using a rapid placement machine (e.g., a "chip shooter"). Rapid placement machines may place relatively simple (and optionally packaged and/or passivated) components onto a substrate using a relatively low-precision, high-speed pick-and-place-type process.

Figure 10D:
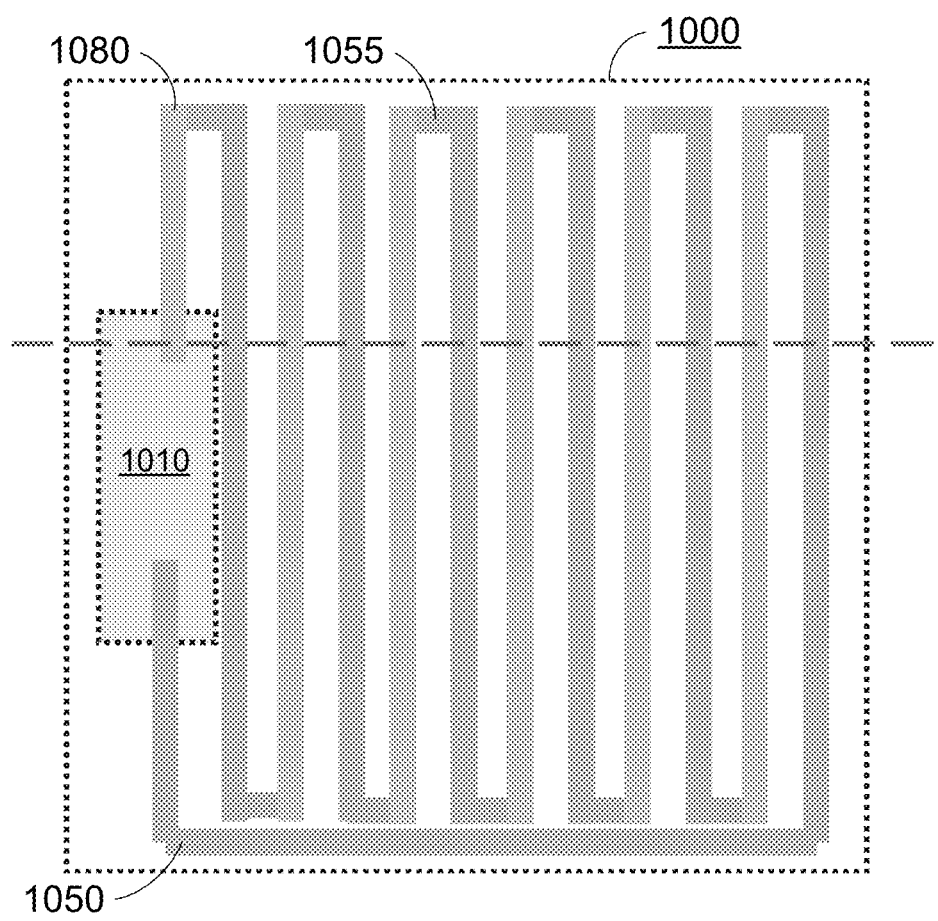
FIG. 10D is a plan view of the conductive and/or electrically active structures of the PIC and integrated antenna made by the method of FIGS. 10A-C.

FIG. 10D is a plan view of the conductive and/or electrically active structures in the structure of FIG. 10C. Benefits of the method exemplified by the structures in FIGS. 10A-D include omitting any step to eliminate extra areas of the metal substrate (i.e., those areas eliminated by punching or etching). However, it may be challenging to comply with conventional label applicators, as the dielectric layers may have greater-than-usual thicknesses, and the final product may become similar to those produced using surface mount technology (SMT). Conventional label applicators may therefore benefit from modification to use a label including the device shown in FIG. 10D. However, lamination for devices such as that shown in FIGS. 10C-D onto an antenna on a separate substrate is known. Thus, the process exemplified in FIGS. 10A-D is manufacturable, and is expected to capable of high-volume commercial production.

Working Example

Figure 11A:
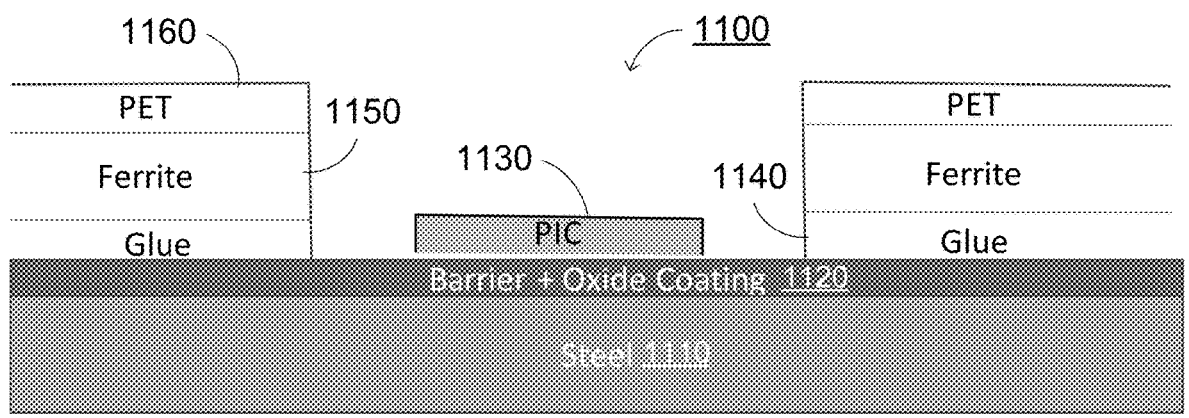
FIGS. 11A-E are diagrams showing a working example of a method for making an exemplary wireless communication device, including a PIC with an integrated antenna connected to the PIC via a metal-and-acrylate bridge.

This working example describes a process flow for a wireless communication device comprising a PIC and an integrated antenna. FIG. 11A shows a cross-sectional view of an exemplary intermediate device 1100, after a ferrite layer (e.g., a sheet or roll) 1150 is deposited or attached to a steel substrate 1110. The steel substrate 1110 may comprise a stainless steel foil having a thickness of 1-5 mils (e.g., 25-125 μm), with a multilayer barrier and oxide coating 1120 thereon, including a diffusion barrier layer (e.g., one or more TiN and/or TiAlN layers having a total thickness of 0.3-1.2 μm) and an oxide layer (e.g., 0.3-3 μm thick). The diffusion barrier layer(s) and the oxide layer(s) may be formed in succession on the steel substrate 1110. The ferrite sheet is usually a three-layer structure (comprising the ferrite layer 1150, an underlying glue layer 1140, and an overlying polyethylene terephthalate [PET] coating 1160), and it can be attached to the substrate 1110 and barrier and oxide coating 1120 in a roll-to-roll process. The thickness of the PET 1160, ferrite 1150 and glue 1140 can be varied to control the magnetic permeability of the ferrite (e.g., to meet requirement[s] for a particular application). Standard ferrite layer or sheet thicknesses may vary from 0.05 mm to 0.4 mm.

In this example, the chip size (i.e., width times length) is 1.25 mm×4.50 mm. A stamping process is used on the ferrite sheet to make rectangular holes (e.g., for the PIC to be attached to the substrate), and then the ferrite sheet/roll is glued to the substrate roll in the roll-to-roll process. FIG. 11A shows the cross-sectional view of the intermediate device 1100 after attachment of the ferrite sheet/roll.

Figure 11B:
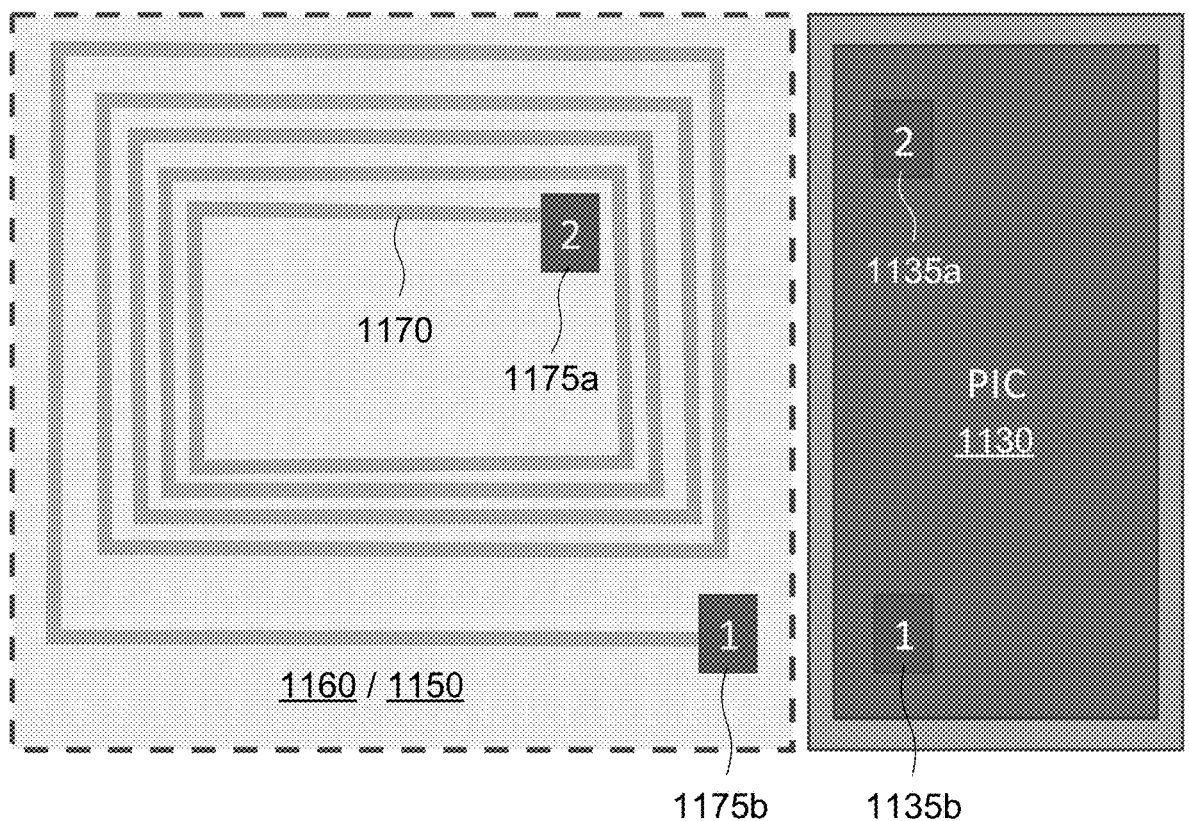

Referring now to FIG. 11B, the antenna 1170 is printed on the ferrite sheet/roll 1140-1160, and more particularly, on the PET layer 1160. The antenna printing method may comprise (i) selectively applying an ink containing an antenna precursor (e.g., by screen printing, inkjet printing, or application with a doctor blade, using a nanomaterial ink) and (ii) curing, although the antenna 1170 can be made using other techniques. The antenna material comprises copper or aluminum, but is not limited to these materials.

Figure 11C:
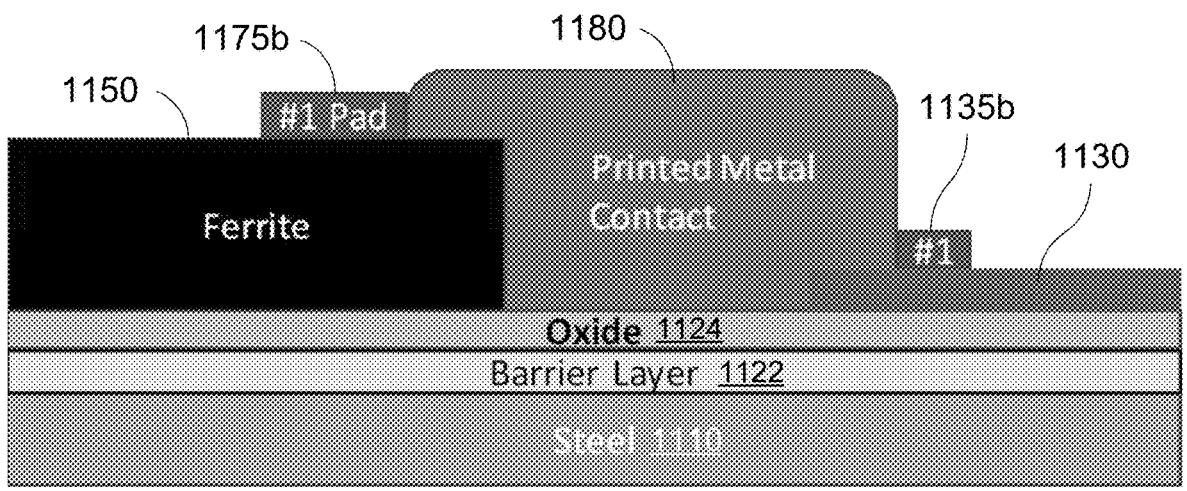

The antenna pads 1175a-b are then attached to the die pads 1135a-b on the PIC. As shown in FIG. 11C, the #1 pad 1175b on the antenna (not shown in FIG. 11C) is connected to the #1 pad 1135b on the PIC 1130 with a metal contact 1180, formed by (i) metal inkjet printing or controlled dispensing and (ii) curing in the roll-to-roll process. The distance between the pads 1135b and 1175b can vary from 50 μm to 2000 μm, depending on the particular design.

Figure 11D:
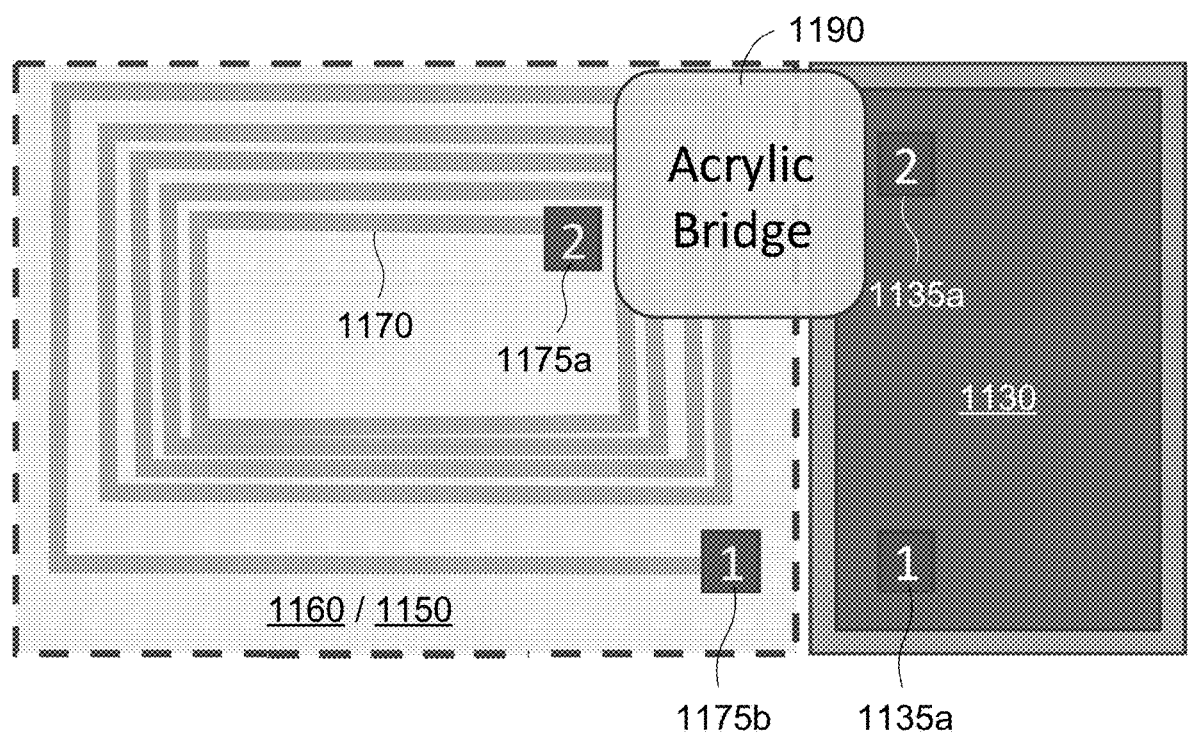

To make contact between the other two pads (i.e., the #2 pads 1135a and 1175a), an acrylic-based (e.g., acrylate ester) monomer may be selectively deposited over the coils or loops of the antenna 1170 between the #2 pads 1135a and 1175a, followed by UV curing to polymerize the monomer and insulate the antenna from an overlying metal strap (e.g., making an acrylic "bridge" 1190 between the #2 pads 1135a and 1175a; see FIG. 11D). The monomer can be selectively deposited by gravure printing, screen printing, inkjet printing, etc., in a continuous roll-to-roll process.

Figure 11E:
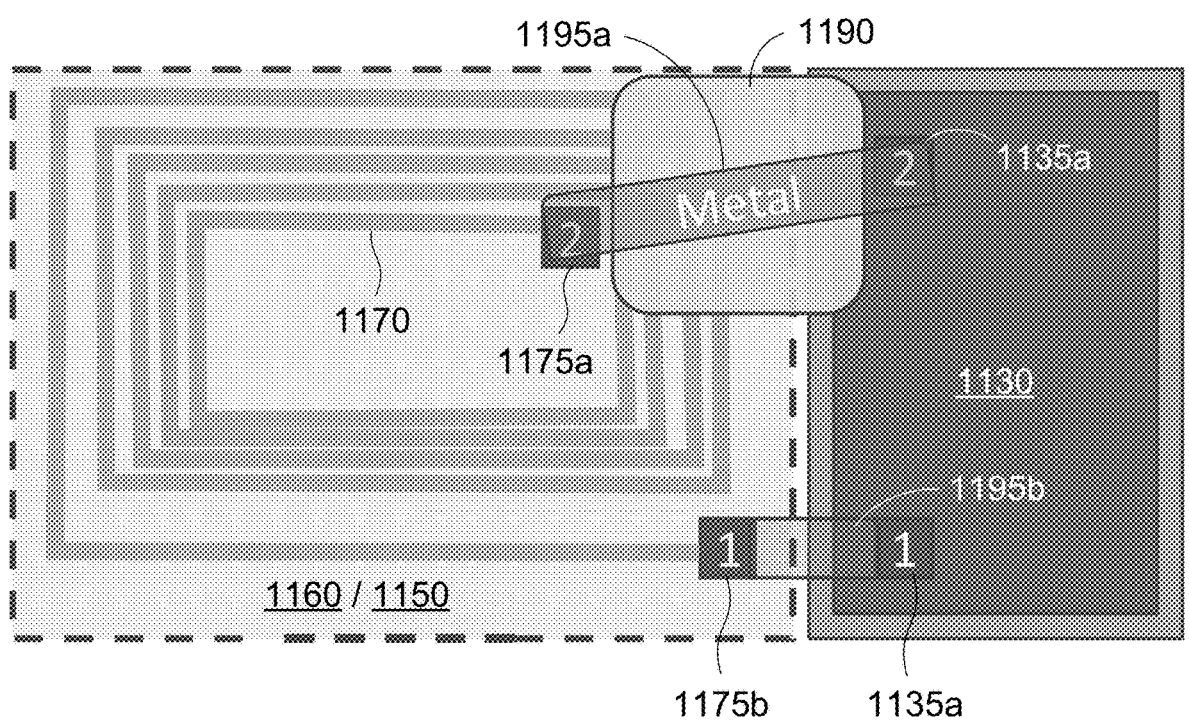

Referring now to FIG. 11E, the metal lines 1195a-b between the #1 pads 1135b and 1175b and the #2 pads 1135a and 1175a can be printed at the same time to complete the connections from the antenna 1170 to the die 1130. In a further embodiment, copper can be deposited (e.g., by electroplating) onto the metal of the antenna 1170 to improve the quality or the quality factor of the antenna 1170.

CONCLUSION/SUMMARY

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A wireless communication device, comprising:
   a) a substrate;
   b) an integrated circuit (IC) comprising a plurality of printed and/or thin film layers or structures mounted on the substrate, the plurality of printed and/or thin film layers or structures including an uppermost layer of metal;
   c) a dielectric or insulator layer in at least one area of the substrate other than the IC; and
   d) an antenna on the dielectric or insulator layer, comprising one or more metal traces, and having (i) an inner terminal continuous with said uppermost layer of metal or connected to said uppermost layer of metal through one or more contacts, and (ii) an outer terminal connected to said uppermost layer of metal through one or more contacts and optionally a metal bridge or strap.

2. The device of claim 1, wherein said antenna has a two-dimensional or planar spiral or coil structure.

3. The device of claim 2, further comprising a ferrite layer between the antenna and the substrate, the ferrite layer being configured to reduce adverse electromagnetic effects of the substrate on the antenna.

4. The device of claim 1, wherein said IC further comprises one or more pads, configured to receive an incoming signal from the antenna and transmit an outgoing signal to the antenna by capacitive or magnetic coupling.

5. The device of claim 1, wherein said antenna has a three-dimensional spiral or coil structure having a rotational axis parallel to the substrate.

6. The device of claim 5, wherein said antenna comprises (i) a first plurality of traces in a lower metal layer, (ii) a second plurality of traces in an upper metal layer, and (iii) a plurality of contacts, wherein each of the plurality of contacts uniquely connects one of the first plurality of traces and one of the second plurality of traces.

7. The device of claim 6, wherein said antenna further comprises a second dielectric or insulator layer between the lower metal layer and the upper metal layer.

8. The device of claim 7, wherein each of the first plurality of traces and the second plurality of traces is linear or substantially linear, the second plurality of traces is offset from the first plurality of traces, and the antenna further comprises a plurality of offset segments, each configured to connect an end of one of the first and second plurality of traces to a corresponding one of the contacts.

9. The device of claim 1, wherein said antenna has a three-dimensional spiral or coil structure having a rotational axis of the spiral perpendicular to the substrate.

10. The device of claim 9, wherein said antenna comprises (i) a plurality of metal layers, (ii) a plurality of insulator layers, each of which is between adjacent ones of the plurality of metal layers, and (iii) a contact in each of the plurality of insulator layers, each contact being configured to connect adjacent ones of the plurality of metal layers.

11. The device of claim 10, wherein each of said plurality of metal layers comprises a trace having a substantially closed geometric shape.

12. The device of claim 11, wherein said antenna comprises a plurality of offset segments, each configured to connect an end of one of the traces to a corresponding one of the contacts.

13. The device of claim 1, wherein said antenna comprises a two-dimensional spiral or coil structure, the metal bridge or strap connecting the outer terminal to said uppermost layer of metal, a first contact directly or indirectly connecting one of the inner and outer terminals and the metal bridge, and a second contact directly or indirectly connecting the metal bridge and the uppermost layer of metal.

14. The device of claim 13, wherein said substrate is patterned to match a pattern of the antenna.

15. The device of claim 13, wherein said substrate includes one or more slits therein, configured to induce controlled eddy currents in the substrate and/or reduce or negate adverse electromagnetic effects of the substrate.

16. The device of claim 1, wherein said substrate comprises a two-dimensional array of metal elements.

17. The device of claim 16, wherein said two-dimensional array of metal elements comprises a plurality of rows of said metal elements and a plurality of columns of said metal elements.

18. The device of claim 16, wherein said each of said metal elements has a regular geometric shape.

19. The device of claim 1, wherein the substrate comprises a center opening.

20. A method of making a wireless communication device, comprising:
   a) forming an integrated circuit (IC) comprising a plurality of printed and/or thin film layers or structures on a substrate, the plurality of printed and/or thin film layers or structures including an uppermost layer of metal;
   b) forming a dielectric or insulator layer in at least one area of the substrate other than the IC; and
   c) forming an antenna on the dielectric or insulator layer, comprising one or more metal traces, and having (i) an inner terminal continuous with said uppermost layer of metal or connected to said uppermost layer of metal through one or more contacts, and (ii) an outer terminal connected to said uppermost layer of metal through one or more contacts and optionally a metal bridge or strap, wherein at least one of the metal traces has a composition and a thickness identical or substantially identical to the uppermost layer of metal.

* * * * *